US012713922B2

(12) United States Patent
Liu et al.

(10) Patent No.: US 12,713,922 B2
(45) Date of Patent: Aug. 18, 2026

(54) POWER MODULE PACKAGING STRUCTURE

(71) Applicants: Advanced Semiconductor Engineering, Inc., Kaohsiung (TW); Universal Scientific Industrial (Shanghai) Co., Ltd., Shanghai (CN)

(72) Inventors: Chih-Ming Liu, Kaohsiung (TW); Yung-Fa Chen, Nantou County (TW); Hung Cheng Chang, Kaohsiung (TW)

(73) Assignees: Advanced Semiconductor Engineering, Inc., Kaohsiung (TW); Universal Scientific Industrial (Shanghai) Co., Ltd., Shanghai (CN)

( * ) Notice: Subject to any disclaimer, the term of this patent is extended or adjusted under 35 U.S.C. 154(b) by 731 days.

(21) Appl. No.: 17/731,203

(22) Filed: Apr. 27, 2022

(65) Prior Publication Data

US 2023/0352368 A1 Nov. 2, 2023

(51) Int. Cl.

| | |
|---|---|
| ***H10W 40/77*** | (2026.01) |
| ***H10W 40/10*** | (2026.01) |
| ***H10W 40/22*** | (2026.01) |
| ***H10W 40/25*** | (2026.01) |
| ***H10W 90/00*** | (2026.01) |
| ***H10W 90/20*** | (2026.01) |

(52) U.S. Cl.

CPC ....... *H10W 40/778* (2026.01); *H10W 40/258* (2026.01); *H10W 90/00* (2026.01); *H10W 90/288* (2026.01); *H10W 90/811* (2026.01); *H10W 40/10* (2026.01); *H10W 40/22* (2026.01); *H10W 90/291* (2026.01)

(58) Field of Classification Search

None

See application file for complete search history.

(56) References Cited

U.S. PATENT DOCUMENTS

| | | | | |
|---|---|---|---|---|
| 5,532,512 | A * | 7/1996 | Fillion | H01L 25/074 361/705 |
| 6,084,771 | A * | 7/2000 | Ranchy | H05K 7/20927 361/716 |
| 8,946,567 | B2 | 2/2015 | Nakatsu et al. | |
| 9,070,666 | B2 | 6/2015 | Mamitsu et al. | |
| 2002/0024129 | A1* | 2/2002 | Hirahara | H01L 25/07 257/691 |
| 2004/0113275 | A1* | 6/2004 | Karnezos | H01L 25/0652 257/E25.023 |
| 2009/0097208 | A1* | 4/2009 | Matz | H01L 25/071 361/711 |
| 2021/0151417 | A1* | 5/2021 | Strogies | H01L 23/34 |
| 2023/0238361 | A1* | 7/2023 | Su | H01L 23/13 257/703 |

* cited by examiner

*Primary Examiner* — Julio J Maldonado
*Assistant Examiner* — Pinaki Das
(74) *Attorney, Agent, or Firm* — Foley and Lardner LLP

(57) ABSTRACT

A power module is disclosed. The power module includes a first conductive plate, a first power component, and a second power component. The first conductive plate has a first side and a second side opposite to the first side; The first power component is disposed at the first side. The second power component is disposed at a first location of the second side distinct from a second location of the second side. The second location is configured to transfer most heat from the first power component to the second power component if the second power component is disposed at the second location.

16 Claims, 25 Drawing Sheets

100

100

S201 Forming a first conductive plate

S202 Forming a first conductive trace to surround the first conductive plate, wherein the first conductive plate is connected to the first conductive trace via a conductive leash S203 Forming a plurality of first spacers on the first conductive plate S205 Forming a second conductive plate on the plurality of first spacers S207 Forming a plurality of second spacers on the first conductive plate S208 Forming an encapsulant to cover the first conductive plate, the second conductive plate, and the third conductive plate S209 Forming a third conductive plate on the plurality of second spacers S210 Removing the conductive leash

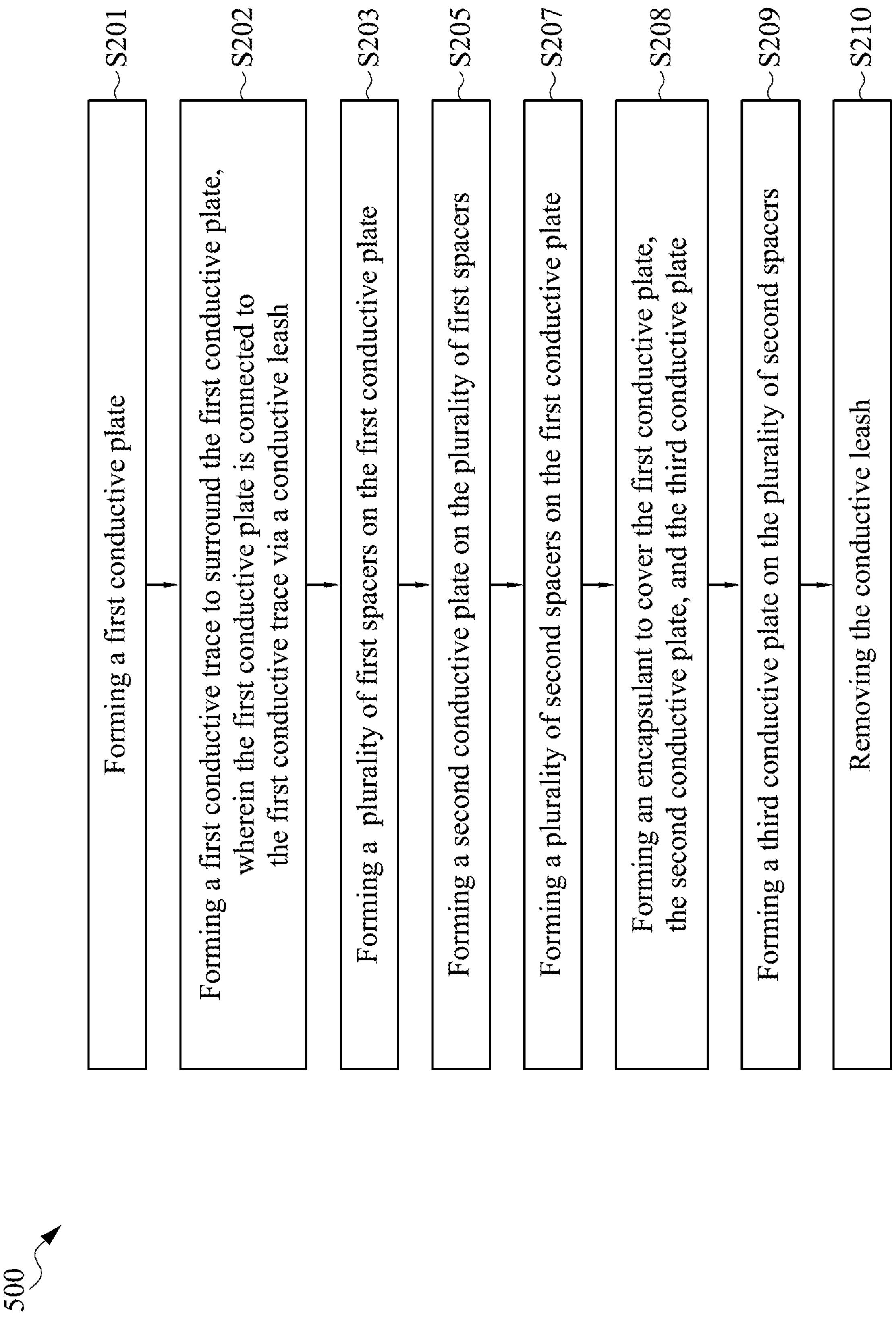

FIG. 25

POWER MODULE PACKAGING STRUCTURE

BACKGROUND

1. Field of the Disclosure

The present disclosure relates to a power module, and in particular to a power module including a conductive plate and a power component.

2. Description of the Related Art

As power from power modules increases to fulfill higher charge rates, heat dissipation challenges become more frequent.

SUMMARY

In some embodiments, a power module includes a first conductive plate, a first power component, and a second power component. The first conductive plate has a first side and a second side opposite to the first side; The first power component is disposed at the first side. The second power component is disposed at a first location of the second side distinct from a second location of the second side. The second location is configured to transfer most heat from the first power component to the second power component if the second power component is disposed at the second location.

In some embodiments, a power module includes a first conductive plate and a plurality of first power components. The first conductive plate includes a first part and a second part spaced apart from the first part. The plurality of first power components disposed on the first part of the first conductive plate and electrically connecting to the second part of the first conductive plate.

In some embodiments, a power module includes a first power component, a second power component, a first conductive plate, and a protective layer. The second power component is disposed below the first power component. The first conductive plate is disposed between the first power component and the second power component and defines an opening through the first conductive plate. The protective layer encapsulates the first power component and second power component and partially disposed within the opening.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

FIG. 25 is a flowchart of an exemplary method of manufacturing a power module packaging structure according to some embodiments of the present disclosure.

DETAILED DESCRIPTION

Figure 1:
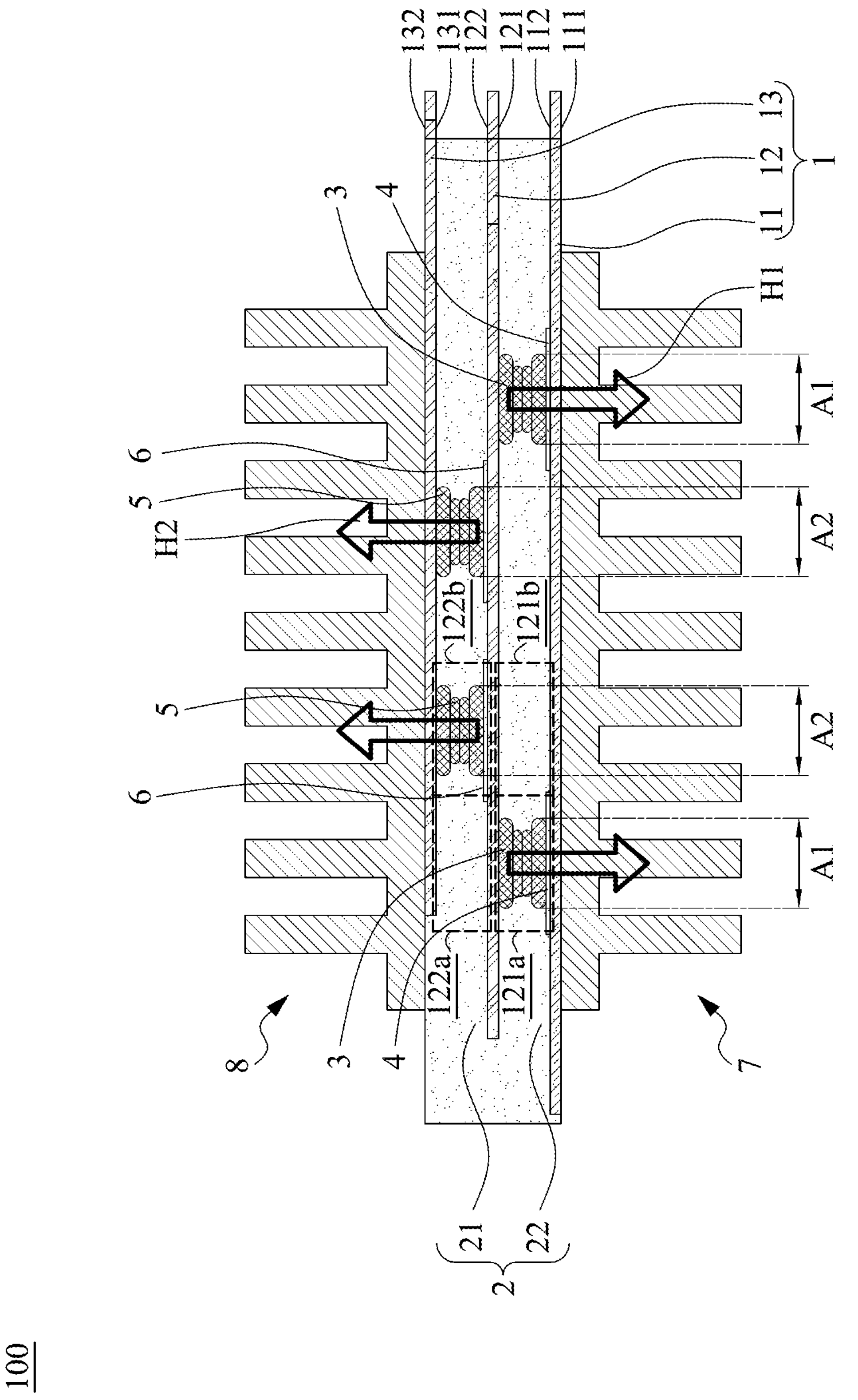
FIG. 1 is a cross-section of an exemplary power module according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
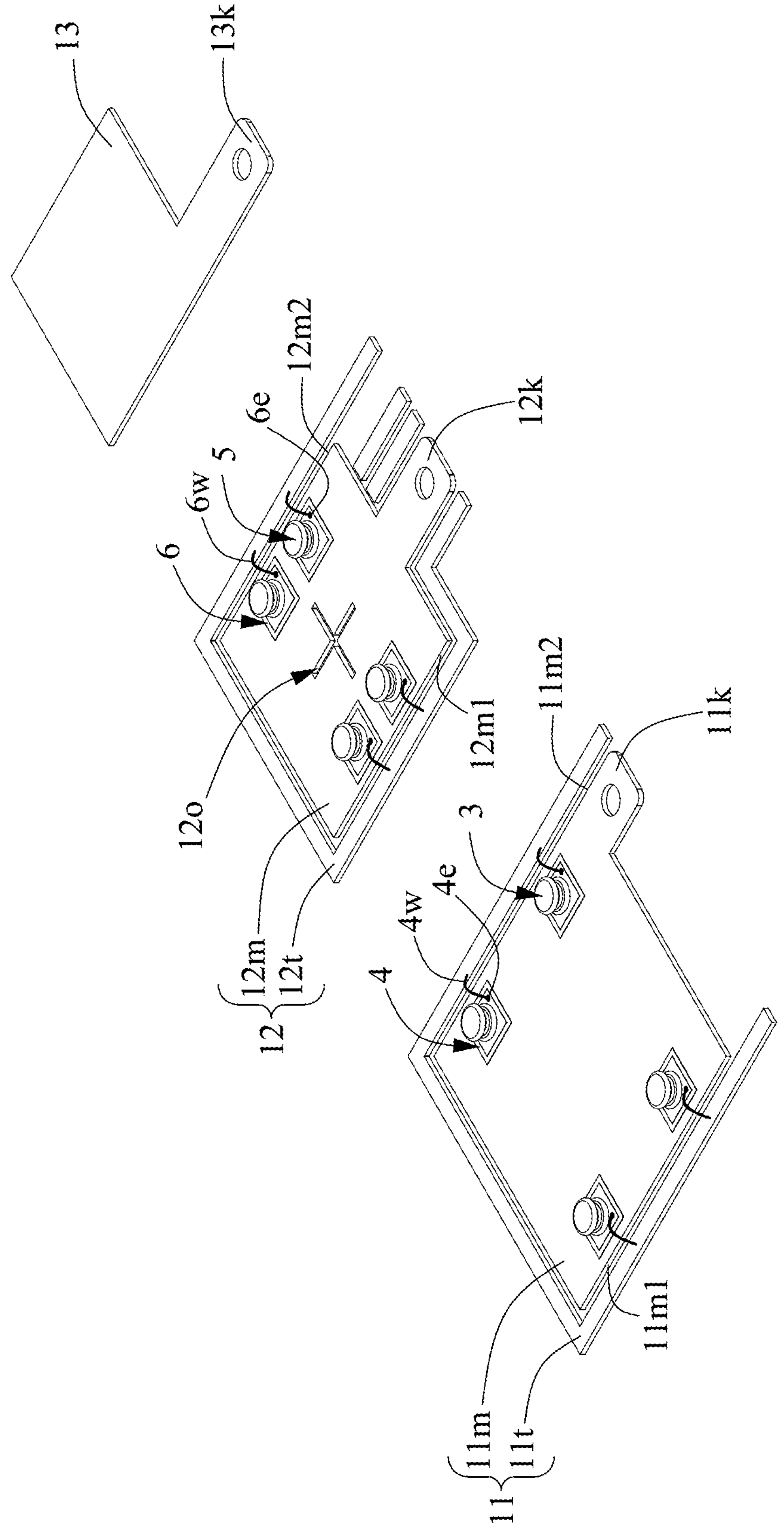
FIG. 2 is an exploded view of an exemplary power module according to some embodiments of the present disclosure.

FIG. 1 is a cross-section of an exemplary power module 100 according to some embodiments of the present disclosure. FIG. 2 is an exploded view of an example of the power module 100 according to some embodiments of the present disclosure. The power module 100 may include a plurality of conductive plates 1, a protective layer 2, a plurality of spacers 3, a plurality of power components 4, a plurality of spacers 5, a plurality of power components 6, a first heat dissipation structure 7, and a second heat dissipation structure 8. The exploded view as illustrated in FIG. 2 may exclude the protective layer 2, the first heat dissipation structure 7, and a second heat dissipation structure 8 for the purpose of simplicity.

The plurality of conductive plates 1 may include a conductive plate 11, a conductive plate 12, and a conductive plate 13. The conductive plate 12 may be disposed above the conductive plate 11. The conductive plate 13 may be disposed above the conductive plate 12. The conductive plate 11 may have an end portion ilk exposed by the protective layer 2. The conductive plate 12 may have an end portion 12*k* exposed by the protective layer 2. The conductive plate 13 may have an end portion 13*k* exposed by the protective layer 2. As shown in FIG. 2, the end portion 11*k* of the conductive plate 11 may protrude from a body portion thereof. The end portion 12*k* of the conductive plate 12 may protrude from a body portion thereof. The end portion 13*k* of the conductive plate 13 may protrude from a body portion thereof. The conductive plate 11 may have a keyhole configured to secure the conductive plate 11 with an external substrate. The conductive plate 12 may have a keyhole configured to secure the conductive plate 12 with an external substrate. The conductive plate 13 may have a keyhole configured to secure the conductive plate 13 with an external substrate.

The conductive plate 11 may have a surface (or a side) 111 and a surface (or a side) 112 opposite to the surface 111. The surface 111 may face the first heat dissipation structure 7. The surface 111 may face away from the conductive plate 12 and be exposed by the protective layer 2. The surface 112 may face the conductive plate 12. The conductive plate 12 may have a first surface (or a side) 121 and a second surface (or a side) 122 opposite thereto. The surface 121 may face the conductive plate 11. The surface 122 may face the conductive plate 13. The conductive plate 13 may have a surface (or a side) 131 and a surface (or a side) 132 opposite to the surface 111. The surface 132 may face the second heat dissipation structure 8. The surface 132 may face away from the conductive plate 12 and exposed by the protective layer 2.

In some embodiments, the conductive plate 11, the conductive plate 12, the conductive plate 13 may each include conductive materials, such as copper (Cu), tin (Sn), aluminum (Al), gold (Au), silver (Ag), tungsten (W), nickel (Ni), iron (Fe), or other suitable materials.

The protective layer 2 may cover the conductive plate 11, the conductive plate 12, and the conductive plate 13. The protective layer 2 may cover at least one edge of the conductive plate 11. The protective layer 2 may cover at least one edge of the conductive plate 12. The protective layer 2 may cover at least one edge of the conductive plate 13. The protective layer 2 may include a first portion 21 and the second portion 22 disposed above the first portion 21. The first portion 21 may be disposed between the conductive plate 11 and the conductive plate 12. The second portion 22 may be disposed between the conductive plate 12 and the conductive plate 13. The first portion 21 may be connected to the second portion 22. The first portion 21 and the second portion 22 may be in contact with each other outside of the at least one edge of the conductive plate 12. As shown in FIG. 2, the second conductive plate 2 may define an opening (or a window element) 12*o*. The opening 12*o* may have sidewalls extending from the surface 121 and the surface 122 of the second conductive plate 2. The first portion 21 and the second portion 22 may be in contact with each other through an opening. In other words, the first portion 21 and/or the second portion 21 of the protective layer 2 may be partially disposed in the opening 12*o*. The opening 12*o* may be cross shaped. In other embodiments, the opening 12*o* may be rectangular, circular, triangular, or of other suitable shapes.

In some embodiments, the protective layer 2 may include an encapsulant, such as, an epoxy resin, a molding compound (e.g., an epoxy molding compound or other molding compound), a polyimide, a phenolic compound or material, a material including a silicone dispersed therein, or a combination thereof.

The plurality of spacers 3 may be disposed between and in contact with the conductive plate 11 and the conductive plate 12. The plurality of spacers 3 may be disposed above the surface 112 of the conductive plate 11. The plurality of spacers 3 may extend between the conductive plate 11 and the conductive plate 12 perpendicular to the surface 112 of the conductive plate 11. The plurality of spacers 3 may be in contact with the surface 121 of the second conductive plate 2. In some embodiments, an adhesive layer may be configured to attach the ends of the plurality of spacers 3 to the surface 121 of the conductive plate 12. The number of the plurality of spacers 3 may be 2 as shown in FIG. 1. Alternatively, the number thereof may be varied, for example, 4, 8, or more.

The plurality of spacers 3 may include a stacking layer. As shown, the intermediate layers may be narrower than the outmost layers. In some embodiments, the plurality of spacers 3 may each include conductive materials, such as copper (Cu), tin (Sn), aluminum (Al), gold (Au), silver (Ag), tungsten (W), nickel (Ni), iron (Fe), or other suitable materials.

As shown in FIG. 2, the power module 100 may have a first conductive trace (e.g., a part) 11*t* disposed around and at the same elevation as a main part (e.g., a part) 11*m* of the conductive plate 11. The part 11*t* may be spaced part from the part 11*m*. The plurality of power components 4 may be disposed on the part 11*m* of the conductive plate 11 and electrically connect to the part 11*t* of the conductive plate 11.

As shown in FIG. 2, the plurality of power components 4 may be arranged along an edge of the part 11*m* of the conductive plate 11. In some embodiments, the part 11*m* of the conductive plate 11 may have a first edge 11*m*1 and a second edge 11*m*2 distinct from the first edge 11*m*1. The part 11*t* of the conductive plate 11*t* may be arranged along the first edge 11*m*1 and the second edge 11*m*2 of the part 11*m* of the conductive plate 11. First one of the plurality of power components 4 may be arranged at the first edge 11*m*1 of the first part 11*m* of the conductive plate 11 and second one of the plurality of power components 4 may be arranged at the second edge 11*m*2 of the part 11*m* of the conductive plate 11.

The power module 100 may have a second conductive trace (e.g., a part) 12*t* disposed around and at the same elevation as a main part (e.g., a part) 12*m* of the conductive plate 12. The part 12*t* may be spaced part from the part 12*m*. The plurality of power components 6 may be disposed on the part 12*m* of the conductive plate 12 and electrically connect to the part 12*t* of the conductive plate 12.

As shown in FIG. 2, the plurality of power components 6 may be arranged along an edge of the part 12*m* of the conductive plate 12. In some embodiments, the part 12*m* of the conductive plate 12 may have a first edge 12*m*1 and a second edge 12*m*2 distinct from the first edge 12*m*1. The part 12*t* of the conductive plate 12 may be arranged along the first edge 12*m*1 and the second edge 12*m*2 of the part 12*m* of the conductive plate 12. First one of the plurality of power components 6 may be arranged at the first edge 12*m*1 of the first part 12*m* of the conductive plate 12 and second one of the plurality of power components 6 may be arranged at the second edge 12*m*2 of the part 12*m* of the conductive plate 12. The plurality of power components 4 may electrically connect to the plurality of power components 6 through the part 12*m* of the conductive plate 12.

As shown in FIG. 2, the plurality of power components 4 may be disposed on the conductive plate 11. In other words, the conductive plate 11 may be disposed below the power components 4. The power components 4 may be disposed below the power components 6. The plurality of power components 4 may be in contact with the plurality of spacers 3. The plurality of spacers 3 may be attached to the conductive plate 12 through a solder. The plurality of spacers 3 may be attached to the plurality of power components 4 through a solder. Each of the plurality of power components 4 may be electrically connected to the corresponding one of the plurality of spacers 3. The plurality of power components 4 may be electrically connected to the conductive plate 11. The plurality of power components 4 may each have a first contact 4*e* adjacent to the corresponding one of the spacers 3. Each of the power components 4 may include a first transistor having a drain terminal connected to the conductive plate 11, a gate terminal connected to the first contact 4*e* of the first semiconductor device 4, a source terminal connected to the corresponding one of the plurality of spacers 3. The first transistor may be an insulated gate bipolar transistor (IGBT) or a power transistor. The power module 100 may have a plurality of wirings 4*w* each connecting one of the contacts 4*c* of the semiconductor device 4 to the first conductive trace 11*t* of the conductive plate 11. The part 11*t* of the conductive plate 11 comprises a common electrode electrically connected to a gate terminal of each of the transistors of the power components 4. The wirings 4*w* may include a bond wire or formed by a wire-bonding apparatus.

The plurality of spacers 5 may be disposed between and in contact with the conductive plate 12 and the conductive plate 13. The plurality of spacers 5 may be disposed above the surface 122 of the conductive plate 12. The plurality of spacers 5 may extend between the conductive plate 12 and the conductive plate 13 perpendicular to the surface 122 of the conductive plate 12. The plurality of spacers 5 may be in contact with the surface 121 of the second conductive plate 2. In some embodiments, an adhesive layer may be configured to attach the ends of the plurality of spacers 5 to the surface 131 of the conductive plate 13. The number of the plurality of spacers 5 may be 2 as shown in FIG. 1. Alternatively, the number thereof spacers 5 may be varied, for example, 4, 8, or more.

The plurality of spacers 5 may include a stacked layer. As shown, the intermediate layers may be narrower than the outmost layers. In some embodiments, the plurality of spacers 5 may each include conductive materials, such as copper (Cu), tin (Sn), aluminum (Al), gold (Au), silver (Ag), tungsten (W), nickel (Ni), iron (Fe), or other suitable materials.

As shown in FIG. 2, the plurality of power components 6 may be disposed on the conductive plate 12. The conductive plate (13 may be disposed above the power components 6. The plurality of power components 6 may be in contact with the plurality of spacers 5. The plurality of spacers 5 may be attached to the conductive plate 13 through a solder. The plurality of spacers 5 may be attached to the plurality of power components 6 through a solder. Each of the plurality of power components 6 may be electrically connected to the corresponding one of the plurality of spacers 5. The plurality of power components 6 may be electrically connected to the conductive plate 12. The plurality of power components 6 may each have a second contact 6*e* adjacent to the corresponding one of the spacers 5. Each of the power components 6 may include a second transistor having a drain terminal connected to the conductive plate 12, a gate terminal connected to the second contact 6*e* of the second semiconductor device 6, a source terminal connected to the corresponding one of the plurality of spacers 5. The second transistor 6 may be an insulated gate bipolar transistor (IGBT) or a power transistor. The power module 100 may have a plurality of wirings 6*w* each connecting one of the second contacts 6*c* of the second semiconductor device 6 to the second conductive trace 12*t* of the conductive plate 12. The part 12*t* of the conductive plate 12 comprises a common electrode electrically connected to a gate terminal of each of the transistors of the power components 6. The wirings 6*w* may include a bond wire or formed by a wire-bonding apparatus.

In some embodiments, the conductive plate 12 may be disposed between the power components 6 and the power components 4. The power components 6 may be disposed at the side 122. The power components 4 may be disposed at a first location 121*a* of the second side 121 distinct from a second location 121*b* of the second side. The first location 121 or the first location 122 may be defined as a location defined by a portion of the side 121 of the conductive plate 12 and the side 112 of the conductive plate 11. The second location 121*b* is configured to transfer most heat from the power components 6 to the power components 4 if the power components 4 is disposed at the second location 121*b*. The heat dissipation capability of the first location 121*a* may be greater than that of the second location 121*b*. The spacers 3 may be disposed within the first location 121*a* and electrically connecting the power components 4 to the conductive plate 12. The spacers 3 may be configured to reduce the crosstalk between the conductive plate 12 and the conductive plate 11 when the conductive plate 12 or the conductive plate 11 receives an input signal. The spacers 5 may be disposed between the power components 6 and the conductive plate 13 and electrically connecting the power components 6 to the conductive plate 13 to avoid the cross-talk between the conductive plate 12 and the conductive plate 13.

The first heat dissipation structure 7 may be disposed on the surface 111 of the conductive plate 11. The first heat dissipation structure 7 may be in contact with the conductive plate 11. The first heat dissipation structure 7 may be connected to the surface 111 of the conductive plate 11 through an adhesion layer (not shown), such as a heat dissipation gel. The surface 111 of the conductive plate 11 may include a heat sink, such as heat dissipation fins, a cooling channel, or a heat dissipation plate. In some embodiments, the first heat dissipation structure 7 may be connected to an external liquid cooling system (e.g., a liquid cooling pipeline of an automobile) to dissipate the heat from the power module 100. The first heat dissipation structure 7 may be configured to dissipate the heat of the power module 100 to an external environment. The first heat dissipation structure 7 may be configured to dissipate the heat from the conductive plate 12, the plurality of spacers 3, the plurality of semiconductor devices 4, and/or the conductive plate 11 to an external environment. In some embodiments, the conductive plate 11 may be configured to transfer a heat from the power components 4 to the first heat dissipation structure 7.

The second heat dissipation structure 8 may be disposed on the surface 132 of the conductive plate 13. The second heat dissipation structure 8 may be in contact with the conductive plate 13. The second heat dissipation structure 8 may be connected to the surface 132 of the conductive plate 13 through an adhesion layer (not shown), such as a heat dissipation gel. The surface 132 of the conductive plate 13 may include a heat sink, such as heat dissipation fins, a cooling channel, or a heat dissipation plate. In some embodiments, the second heat dissipation structure 8 may be connected to an external liquid cooling system (e.g., a liquid cooling pipeline of an automobile) to dissipate the heat from the power module 100. The second heat dissipation structure 8 may be configured to dissipate the heat of the power module 100 to an external environment. The second heat dissipation structure 8 may be configured to dissipate the heat from the conductive plate 12, the plurality of spacers 5, the plurality of semiconductor devices 6, and the conductive plate 13 to an external environment. The conductive plate 13 may be configured to transfer a heat from the power components 6 to the second heat dissipation structure 8.

Referring again to FIG. 1, the first plurality of spacers 3 may have a first projecting area A1 on the surface 111 of the conductive plate 11 and the second plurality of spacers 5 may have a second projecting area A2 on the surface 111 of the conductive plate 11. Therefore, the first plurality of spacers 3 may be non-overlapping with the second plurality of spacers 5 perpendicular to the surface 111 of the conductive plate 11. A first heat dissipation path H1 may be established by heat absorption of the first heat dissipation structure 7. The first heat dissipation structure 7 may be disposed below the power component 4 and configured to provide the first heat dissipation path H1 for the power component 4. Heat generated from the spacers 3 and the power components 4 may be transferred to the first heat dissipation structure 7 along the first heat dissipation A1. Further, heat generated from the spacers 5 and the power components 6 may be transferred to the first heat dissipation structure 7 along the first heat dissipation A1. A second heat dissipation path H2 may be established by heat absorption of the second heat dissipation structure 8. The second heat dissipation structure 8 may be disposed over the power component 6 and configured to provide a second heat dissipation path H2 for the power component 4. Heat generated by the spacers 5 and the power components 6 may be transferred to the second heat dissipation 8 along the second heat dissipation H2. In addition, heat generated from the spacers 3 and the power components 4 may be transferred to the second heat dissipation 8 along the second heat dissipation H2. That is, the first heat dissipation structure 7 may be used to dissipate heat generated by the spacers 3 and the power components 4 and the heat generated by the spacers 5 and the power components 6, and the second heat dissipation structure 8 may be used to dissipate heat generated by the spacers 3 and the power components 4 and the heat generated by the spacers 5 and the power components 6. None of the spacers 3 overlaps the spacers 5 perpendicular to the surface 111 of the conductive plate 11 or from a top view perspective (which will be discussed later). The dislocation relationship of the plurality of spacers 3 and the plurality of spacers 5 may prevent the heat generated by the spacers 3 and the power components 4 and the heat generated by the spacers 5 and the power components 6 from being accumulated and thus enables more efficient heat dissipation.

In some comparative embodiments, the semiconductor devices of a power module may be arranged at the same elevation, which may hinder size reduction efforts for the power module. In the present disclosure, the power module 100 includes the power components 4 and the power components 6 stacked on the power components 4 to reduce the size of the structure. The power dissipation path (or the power transmission path) can be shorter and the power loss can be smaller.

Furthermore, the plurality of the power components 4 and the plurality of the power components 6 are disposed on different surfaces of the conductive plate 12 (e.g., the surface 121 and the surface 122). The conductive plate 12 is configured as the drain terminal of the plurality of the power components 6 and the source terminal of the plurality of the power components 4. As such, the overall power density of the power module 100 can be increased and the form factor of the power module can keep up with the ever-shrinking trend, while providing a power exceeding 850 W, which can be used to provide power to automobile motors.

The spacers 3 and the spacers 5 (or the power components 4 and the power components 6) are disposed in a dislocated arrangement from the top perspective view. Such dislocated arrangement of the spacers 3 and the spacers 5 may prevent the heat generated from the spacers 3 and the power components 4 and the heat generated from the spacers 5 and the power components 6 from being accumulated. Therefore, the heat dissipation of the power module 100 can be improved and any heat accumulation issues can be avoided.

Figure 3:
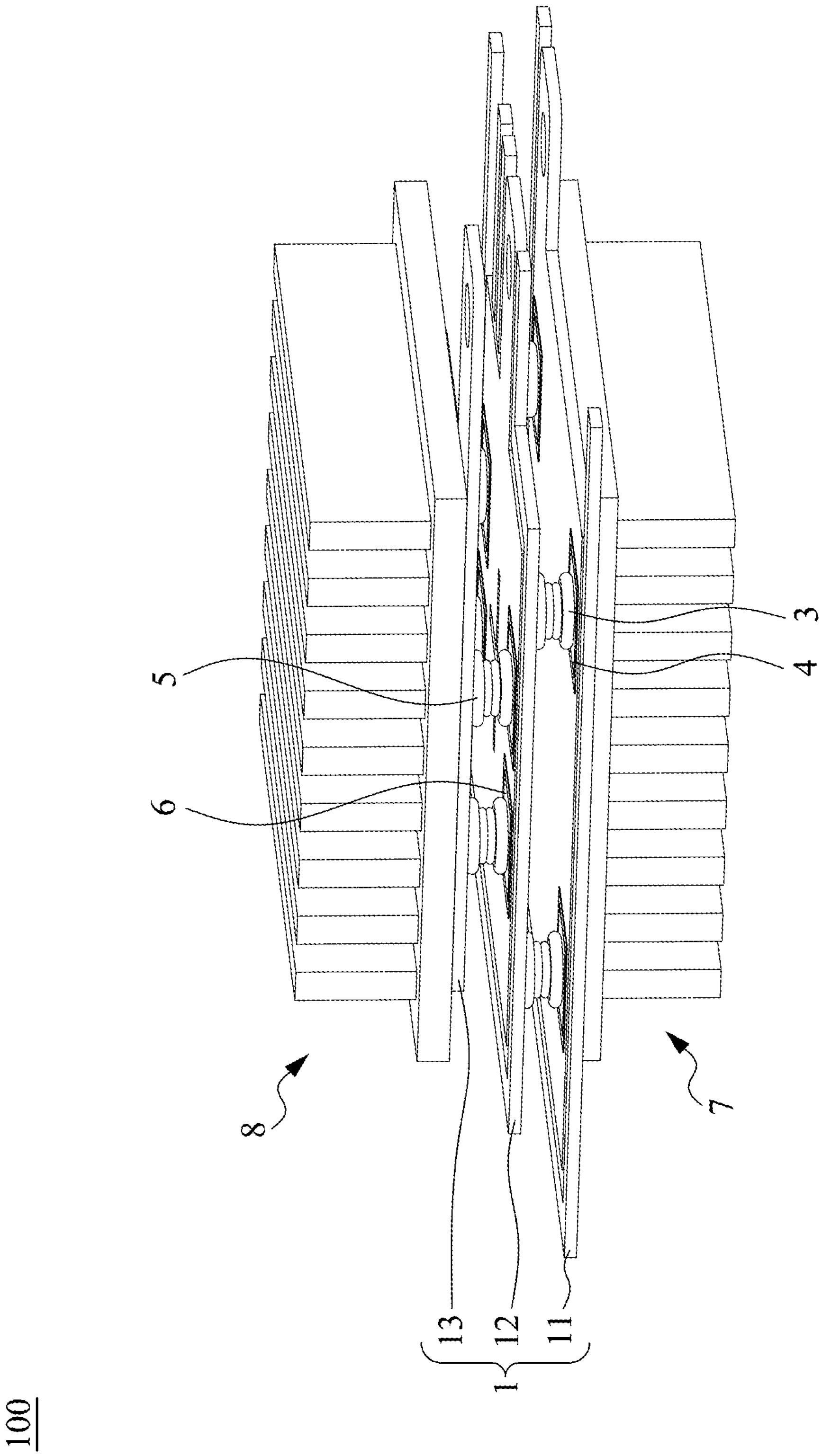
FIG. 3 is a three dimensional (3D) view of an exemplary power module according to some embodiments of the present disclosure.

FIG. 3 is a three dimensional (3D) view of an exemplary power module packaging structure (e.g., the power module 100) according to some embodiments of the present disclosure. The power module 100 as illustrated in FIG. 3 may exclude the protective layer 2 for the purpose of simplicity. As shown in FIG. 3, the conductive plate 12 may be spaced apart from the conductive plate 11 by the spacers 3. The conductive plate 12 may be spaced apart from the conductive plate 13 by the spacers 5.

Figure 4:
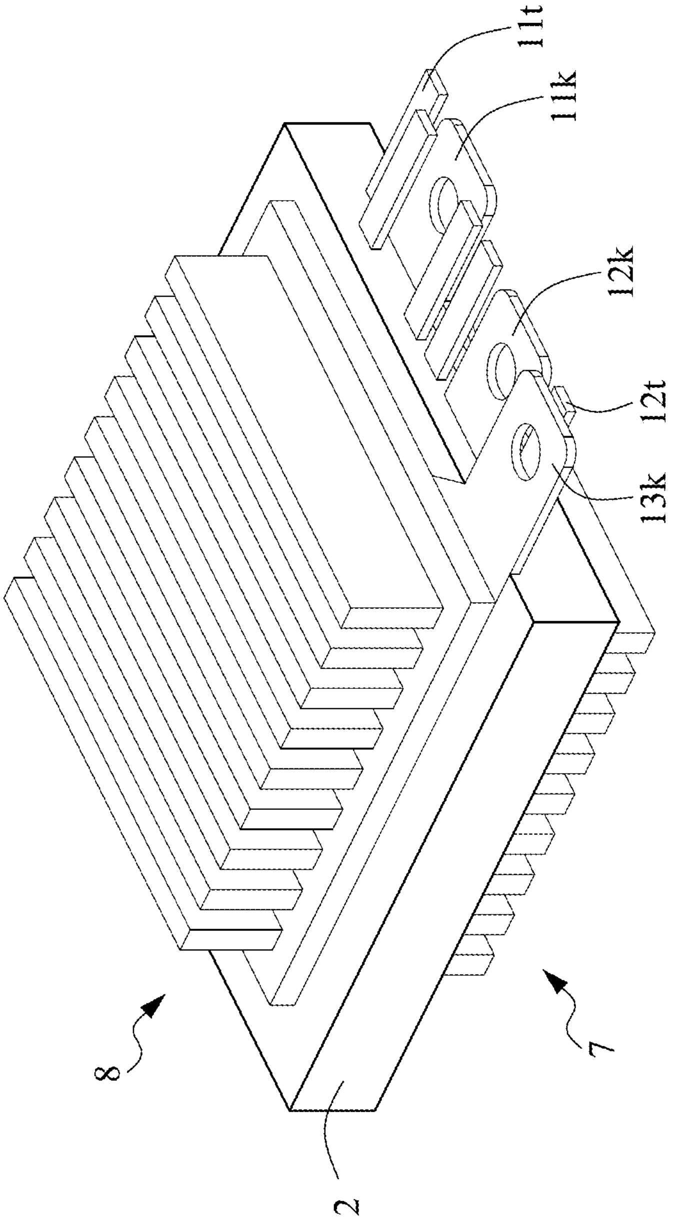
FIG. 4 is a three dimensional (3D) view of an exemplary power module according to some embodiments of the present disclosure.

FIG. 4 is a three dimensional (3D) view of an exemplary power module packaging structure (e.g., the power module 100) according to some embodiments of the present disclosure. As shown in FIG. 4, the end portion Ilk of the conductive plate 11 may be exposed by the protective layer 2. The first conductive trace 11*t* may be exposed by the protective layer 2. In other words, the conductive plate 11 may include a plurality of end portions (e.g., the end portion Ilk and an end portion of the first conductive trace 11*t*) exposed by the protective layer 2, wherein the end portions have different electrical potential. The end portion 11*k* of the conductive plate 11 and the first conductive trace 11*t* may be disposed at the same elevation. The end portion 12*k* of the conductive plate 12 may be exposed by the protective layer 2. The second conductive trace 12*t* may be exposed by the protective layer 2. In other words, the conductive plate 12 may include a plurality of end portions (e.g., the end portion 12*k* and an end portion of the first conductive trace 12*t*) exposed by the protective layer 2, wherein the end portions have different electrical potential. The end portion 12*k* of the conductive plate 12 and the second conductive trace 12*t* may be disposed at the same elevation. The end portion 13*k* of the conductive plate 13 may be exposed by the protective layer 2. The protective layer 2 may be cuboid, cylindrical, or the like.

Figure 5:
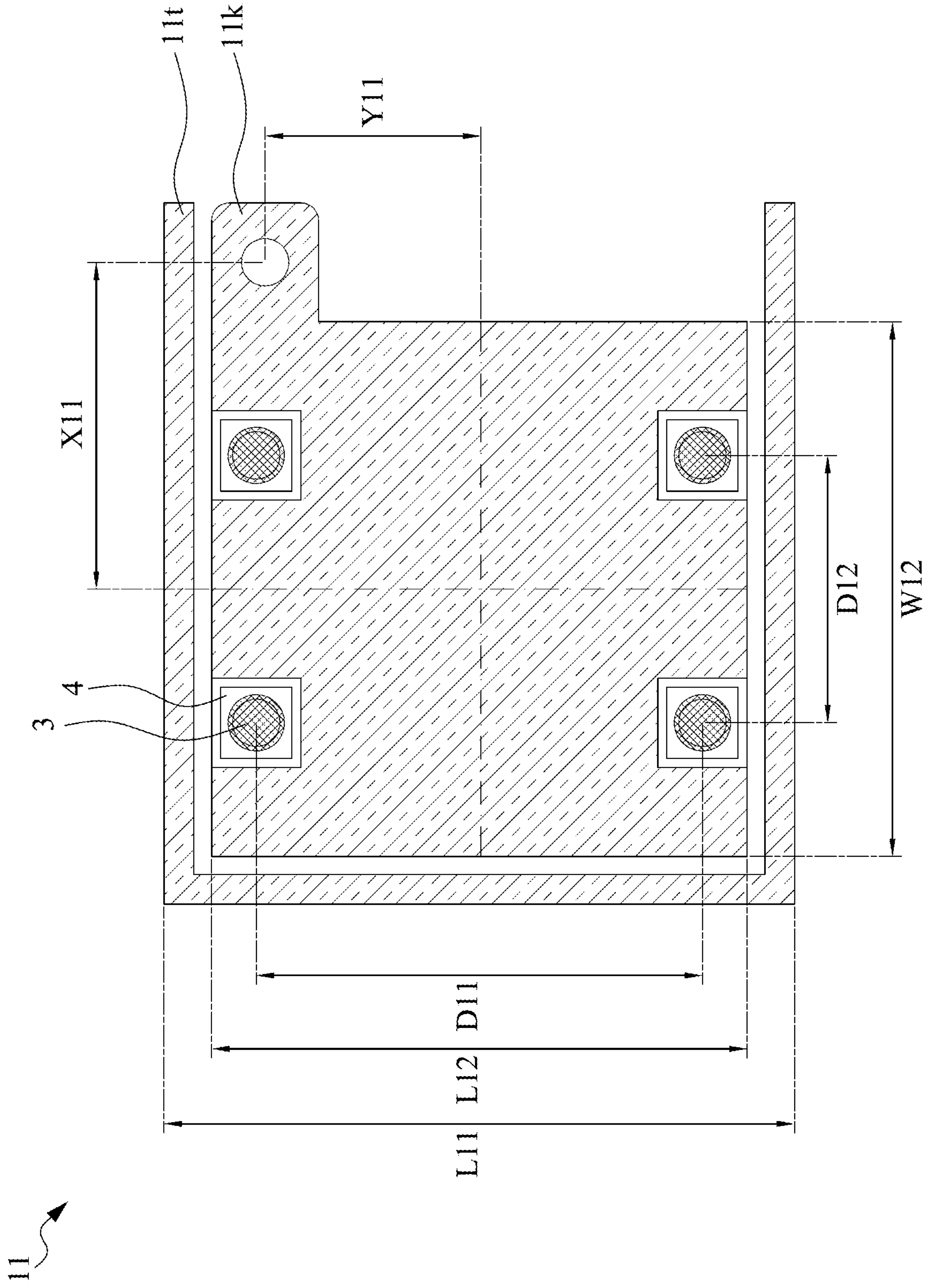
FIG. 5 is a top view of an exemplary first conductive plate of a power module packaging structure according to some embodiments of the present disclosure.

FIG. 5 is a top view of an example of the conductive plate 11 of the power module 100 according to some embodiments of the present disclosure. As shown in FIG. 5, a length from an end of the first conductive trace 11*t* adjacent to the end portion 11*k* of the conductive plate 11 to an end of the first conductive trace 11*t* distant from the end portion ilk of the conductive plate 11 is denoted as "L11." The length "L11" may be around 48 mm. A length of the conductive plate 11 is denoted as "L12." The length "L12" may be around 40 mm. A distance between the centers of the spacers 3 perpendicular to the length "L12" may be denoted as "D11." The distance "D11" may be around 33 mm. A width from an end of the conductive trace 11*t* adjacent to the end portion ilk of the conductive plate 11 to an end of the first conductive trace 11*t* distant from the end portion Ilk of the conductive plate 11 is denoted as "W11." The width "W11" may be around 54 mm. A width of the conductive plate 11 is denoted as "W12." The width "W12" may be around 40 mm. A distance between the centers of the spacers 3 perpendicular to the length "W12" may be denoted as "D12." The distance "D12" may be around 21 mm. A distance of a center of the keyhole of the end portion 11*k* of the conductive plate 11 and a center of the conductive plate 11 along the width "W11" thereof is denoted as "X11." The distance "X11" may be around 26 mm. A distance of the center of the keyhole of the end portion Ilk of the conductive plate 11 and the center of the conductive plate 11 along the length "L12" thereof is denoted as "Y11." The distance "Y11" may be around 16 mm.

Figure 6:
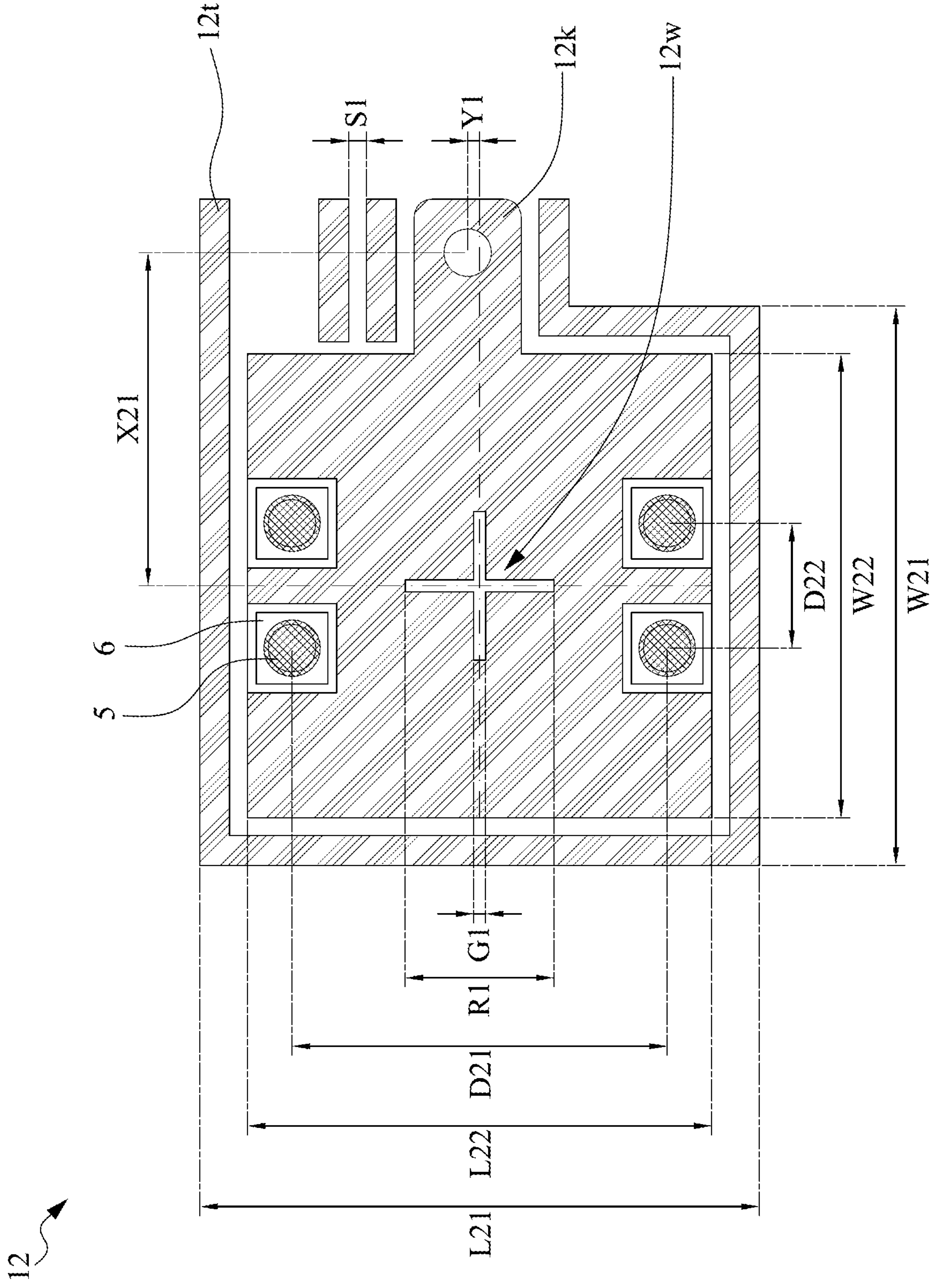
FIG. 6 is a top view of an exemplary second conductive plate of a power module packaging structure according to some embodiments of the present disclosure.

FIG. 6 is a top view of an example of the conductive plate 12 of the power module 100 according to some embodiments of the present disclosure. As shown in FIG. 6, a length from an end of the second conductive trace 12*t* adjacent to the end portion 12*k* of the conductive plate 12 to an end of the second conductive trace 12*t* distant from the end portion 12*k* of the conductive plate 12 is denoted as "L21." The length "L21" may be around 43 mm. A length of the conductive plate 12 is denoted as "L22." The length "L22" may be around 35 mm. A distance between the centers of the spacers 5 perpendicular to the length "L22" may be denoted as "D21." The distance "D21" may be around 28 mm. A width from an end of the second conductive trace 12*t* adjacent to the end portion 12*k* of the conductive plate 12 to an end of the second conductive trace 12*t* distant from the end portion 12*k* of the conductive plate 12 is denoted as "W21." The width "W21" may be around 43 mm. A width of the conductive plate 12 is denoted as "W22." The width "W22" may be around 35 mm. A distance between the centers of the spacers 3 perpendicular to the length "W22" may be denoted as "D22." The distance "D22" may be around 9 mm. A distance of a center of the keyhole of the end portion 12*k* of the conductive plate 12 and a center of the conductive plate 12 along the width "W22" thereof is denoted as "X21." The distance "X21" may be around 29 mm. A distance of the center of the keyhole of the end portion 12*k* of the conductive plate 12 and the center of the conductive plate 12 along the length "L22" thereof is denoted as "Y21." The distance "Y21" may be around 1 mm.

The opening 12*o* of the conductive plate 12 may have a diameter denoted as "R1" and a gap at the center thereof denoted as "G1." The diameter "R1" may be around 16 mm. The width/length of the gap "G1" may be around 2 mm. A space between two ends of the second conductive trace 12*t* is denoted as "S1." The space "S1" may be around 2 mm.

Figure 7:
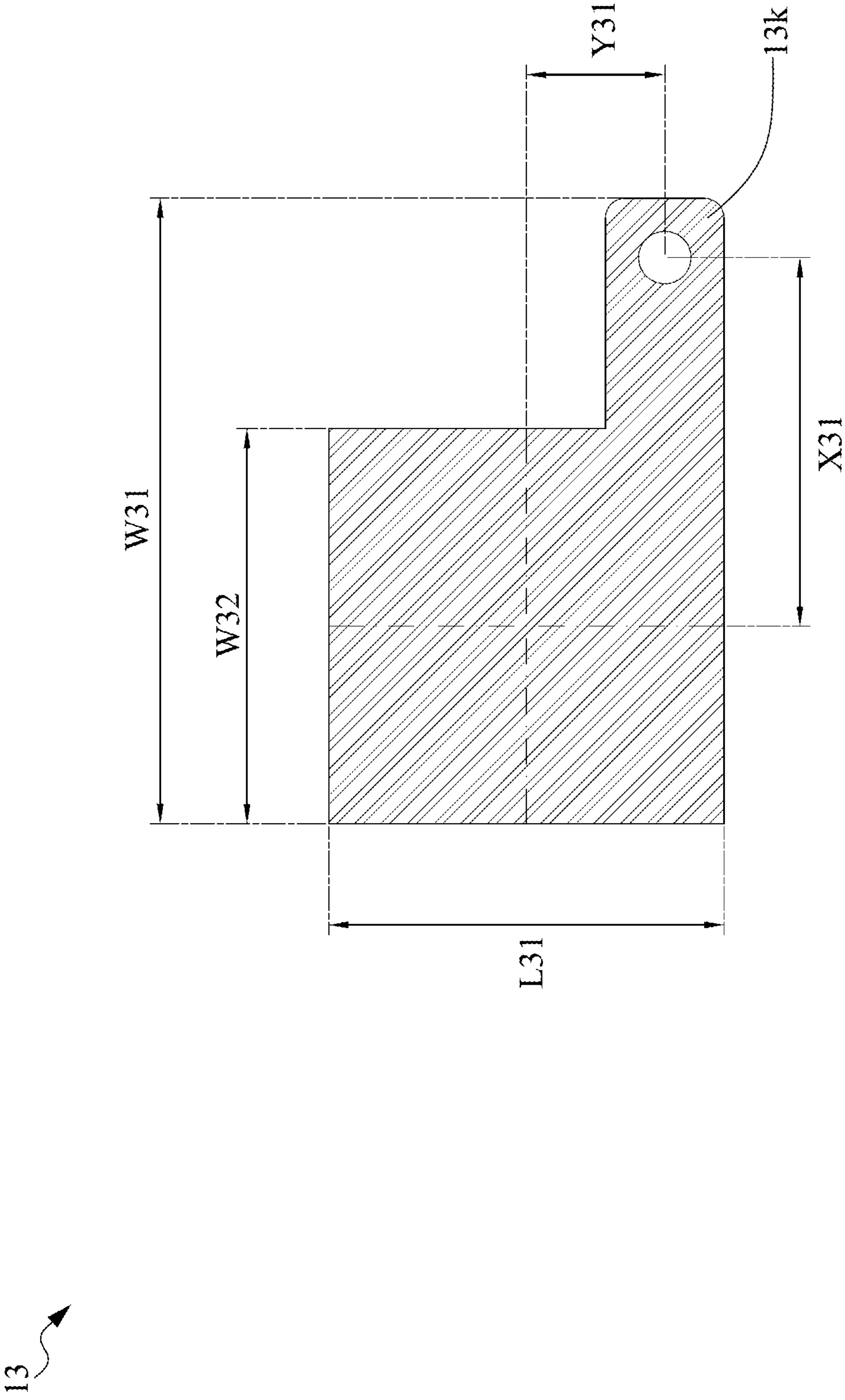
FIG. 7 is a top view of an exemplary third conductive plate of a power module packaging structure according to some embodiments of the present disclosure.

FIG. 7 is a top view of an example of the conductive plate 13 of the power module 100 according to some embodiments of the present disclosure. As shown in FIG. 7, a length of the conductive plate 13 is denoted as "L31." The length "L31" may be around 30 mm. A width of the terminal portion 13*k* and an edge of the conductive plate 13 are denoted as "W31." The width "W31" may be around 30 mm. A width of the conductive plate 11 is denoted as "W32." The width "W32" may be around 40 mm. A distance of a center of the keyhole of the end portion 13*k* of the conductive plate 13 and a center of the conductive plate 13 along the width "W31" thereof is denoted as "X31." The distance "X11" may be around 29 mm. A distance of the center of the keyhole of the end portion 13*k* of the conductive plate 13 and the center of the conductive plate 13 along the length "L31" thereof is denoted as "Y31." The distance "Y31" may be around 11 mm.

Figure 8:
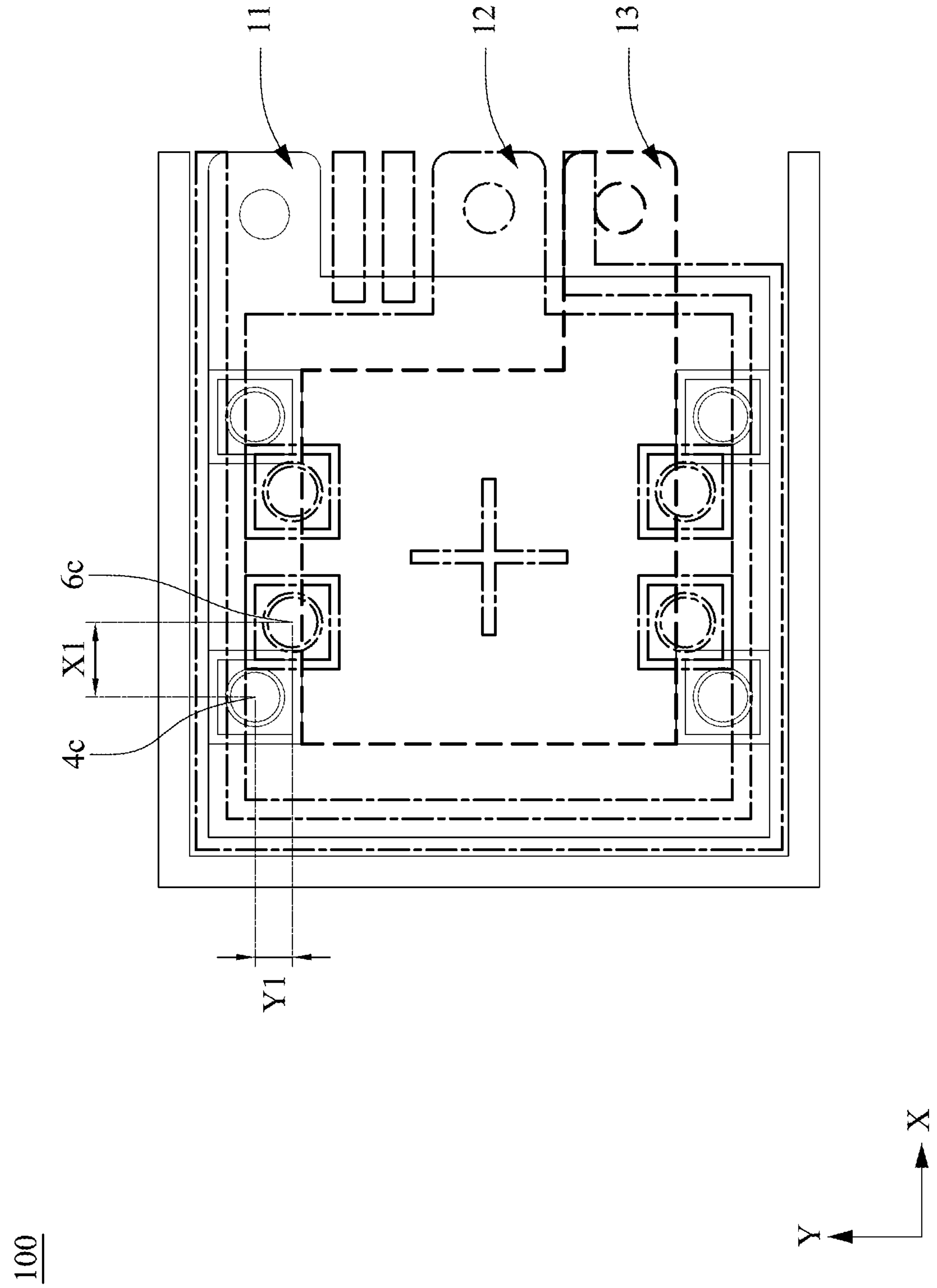
FIG. 8 is a perspective view of an exemplary power module according to some embodiments of the present disclosure.

FIG. 8 is a perspective view of an exemplary power module packaging structure (e.g., the power module 100) according to some embodiments of the present disclosure. As shown in FIG. 8, the conductive plate 11, the conductive plate 12, and the conductive plate 13 are stacked. Different conductive plates are represented with different formats (e.g., the conductive plate 11 in solid line, the conductive plate 12 in chain line, and the conductive plate 13 in dashed line) for the purpose of better understanding. The length of the conductive plate 11 may exceed that of the conductive plate 12, which may exceed that of the conductive plate 13. The width of the conductive plate 11 may exceed that of the conductive plate 12, which may exceed that of the conductive plate 13. The distance between the centers of the spacers 3 may exceed that of the spacers 5. None of the spacers 3 may overlap the spacers 5 from a top view perspective. None of the terminal portions 11*k*, 12*k*, and 13*k* may be non-overlapping from a top view perspective.

As shown in FIG. 8, the power components 6 may have a first center (or a geometric center) 6*c* and the power components 4 may have a first center (or a geometric center) 4*c* shifted from the first center of the power components 6 with a distance X1 in a first direction X. The first center 6*c* of the power components 6 may shifted from the first center 4*c* of the power components 4 with a distance Y1 in a second direction Y substantially perpendicular to the first direction X. The power components 4 and/or 6 may have a rectangular shape, round shape or other suitable shapes.

Figure 9:
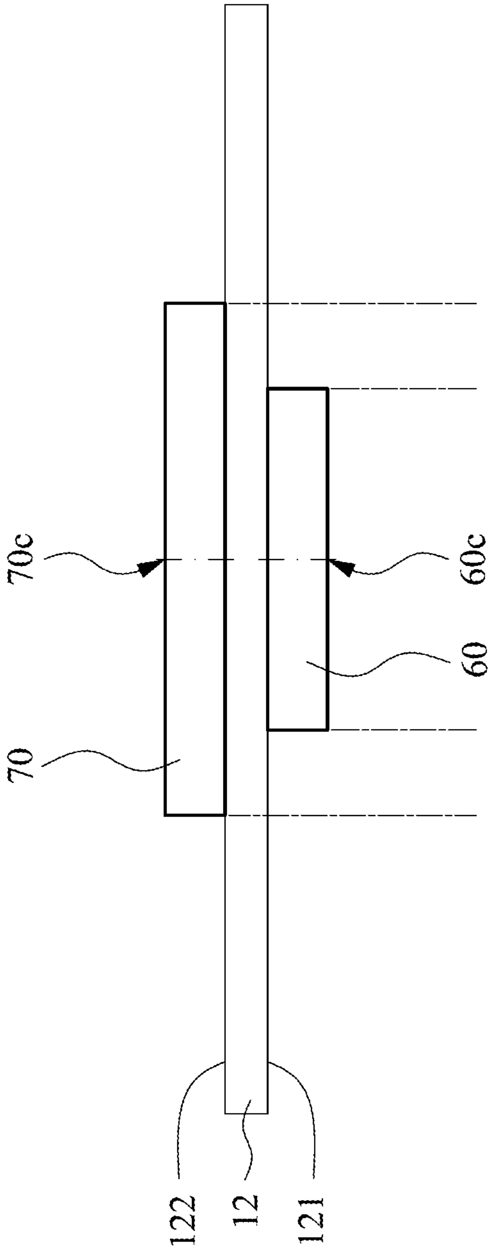
FIG. 9 is a cross-section of an exemplary power module according to some embodiments of the present disclosure.
Figure 10:
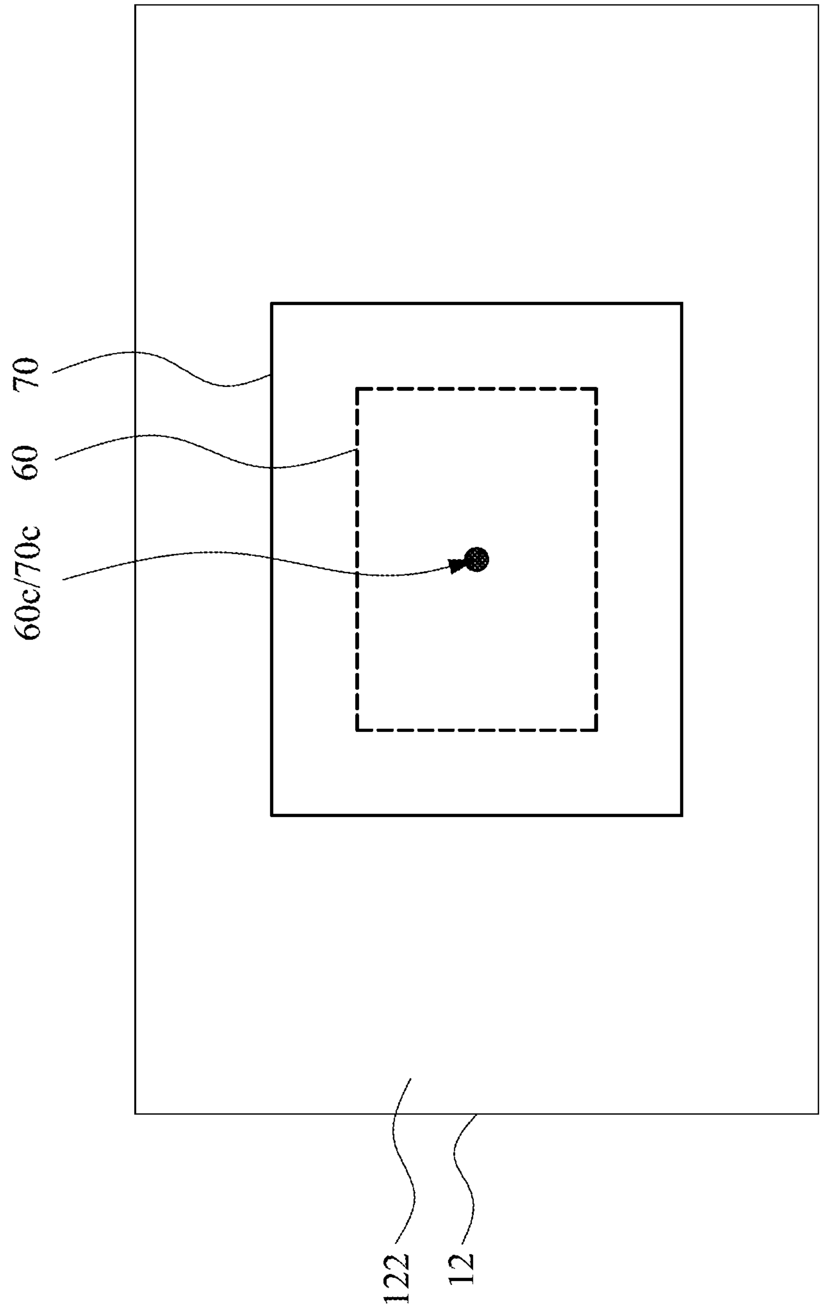
FIG. 10 is a perspective view of an exemplary power module according to some embodiments of the present disclosure.

FIG. 9 is a cross-section of an exemplary power module according to some embodiments of the present disclosure. FIG. 10 is a perspective view of an exemplary power module according to some embodiments of the present disclosure. As shown in FIG. 9 and FIG. 10, a power component 60 may be disposed on the side 121 of the conductive plate 12 and a power component 70 may be disposed on the side 122 of the conductive plate 12. A geometric center 60*c* of the power component 60 may be aligned with a geometric center 70*c* of the power component 70. The power component 70 may have a size greater than that of the power component 60. In other words, a projecting area of the power component 70 completely covers the power component 60 in a direction perpendicular to the side 121 of the conductive plate 12. The alignment of the power components 60 and 70 can lead to the heat generated by the power components 70 and the power component 60 being accumulated and thus the temperature of the power components 70 and 60 may be higher and the performance thereof will be deteriorated.

Figure 11:
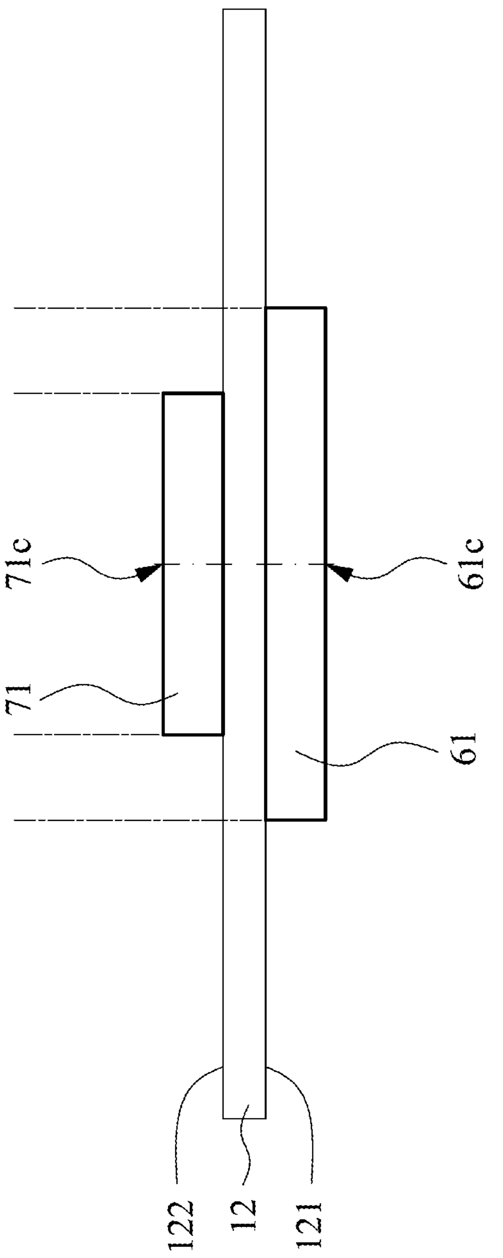
FIG. 11 is a cross-section of an exemplary power module according to some embodiments of the present disclosure.
Figure 12:
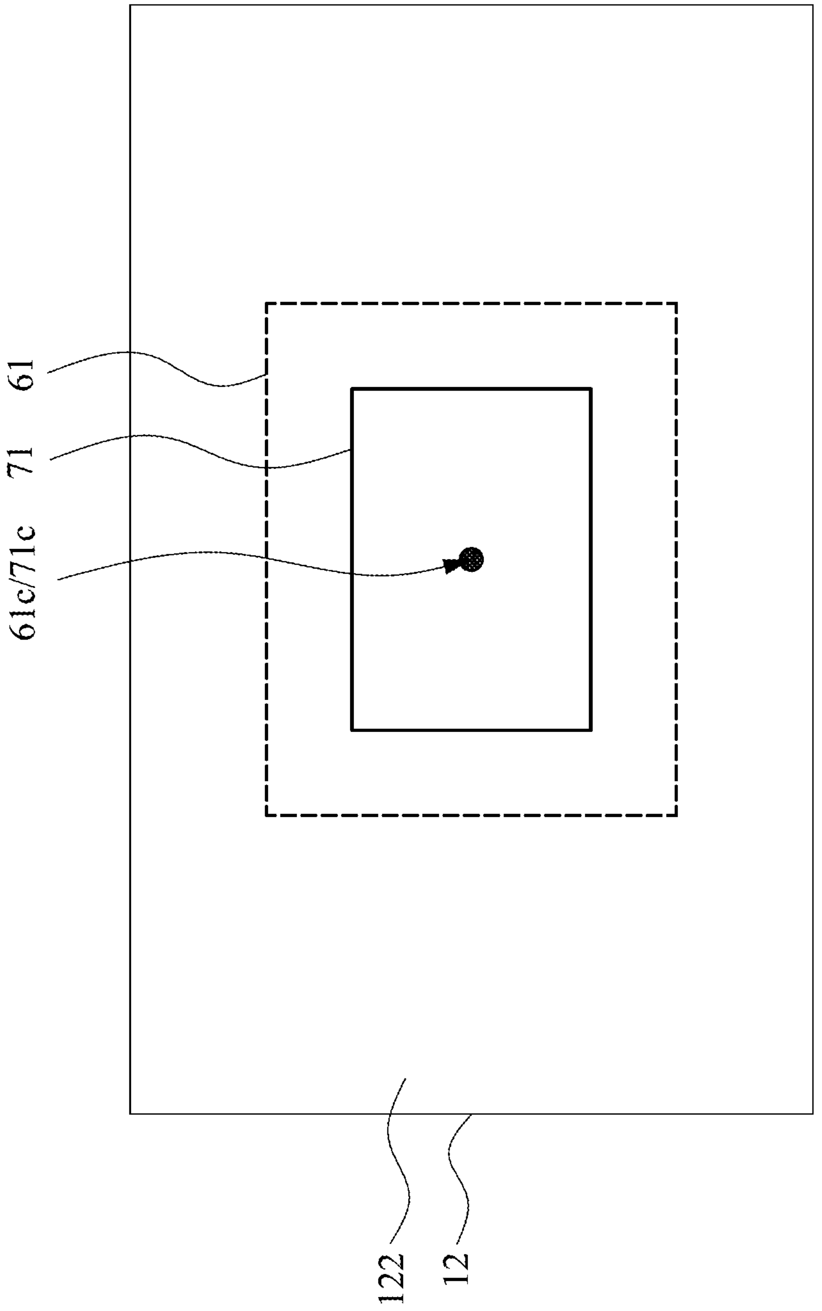
FIG. 12 is a perspective view of an exemplary power module according to some embodiments of the present disclosure.

FIG. 11 is a cross-section of an exemplary power module according to some embodiments of the present disclosure. FIG. 12 is a perspective view of an exemplary power module according to some embodiments of the present disclosure. As shown in FIG. 11 and FIG. 12, a power component 61 may be disposed on the side 121 of the conductive plate 12 and a power component 71 may be disposed on the side 122 of the conductive plate 12. A geometric center 61*c* of the power component 61 may be aligned with a geometric center 71*c* of the power component 71. The power component 61 may have a size greater than that of the power component 71. In other words, a projecting area of the power component 71 completely covers the power component 61 in a direction perpendicular to the side 121 of the conductive plate 12. The alignment of the power components 61 and 71 can lead to the heat generated by the power components 71 and the power component 61 being accumulated and thus the temperature of the power components 71 and 61 may be higher and the performance thereof will be deteriorated.

Figure 13:
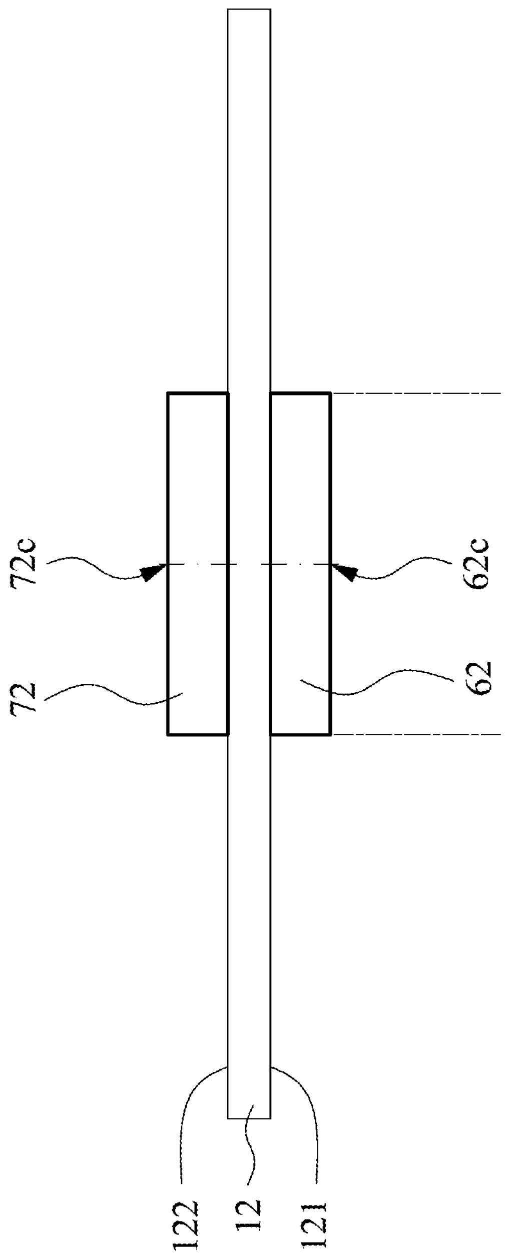
FIG. 13 is a cross-section of an exemplary power module according to some embodiments of the present disclosure.
Figure 14:
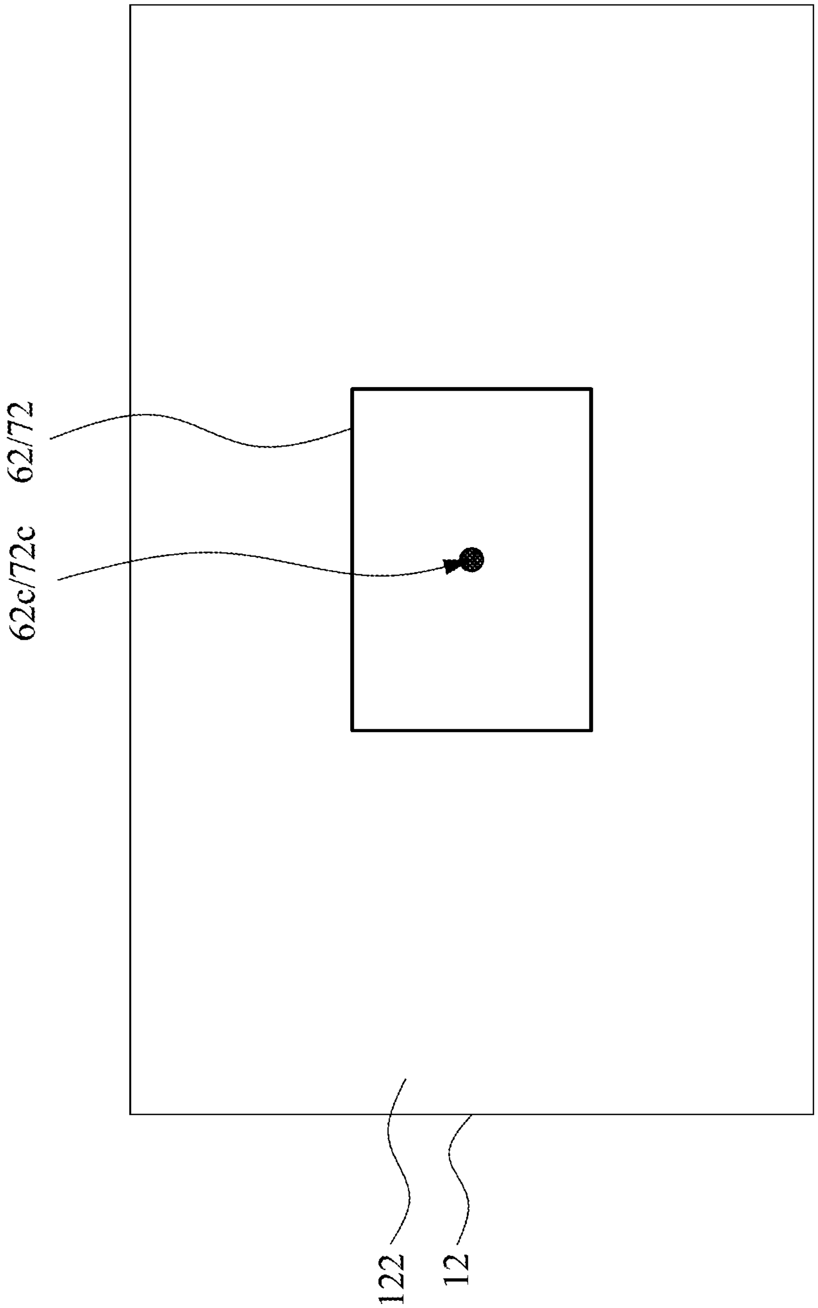
FIG. 14 is a perspective view of an exemplary power module according to some embodiments of the present disclosure.

FIG. 13 is a cross-section of an exemplary power module according to some embodiments of the present disclosure. FIG. 14 is a perspective view of an exemplary power module according to some embodiments of the present disclosure. As shown in FIG. 13 and FIG. 14, a power component 62 may be disposed on the side 121 of the conductive plate 12 and a power component 72 may be disposed on the side 122 of the conductive plate 12. A geometric center 62*c* of the power component 62 may be aligned with a geometric center 72*c* of the power component 72. The power component 72 may have a size the same as that of the power component 62. In other words, a projecting area of the power component 72 completely covers the power component 62 in a direction perpendicular to the side 121 of the conductive plate 12. The alignment of the power components 62 and 72 can lead to the heat generated by the power components 72 and the power component 62 being accumulated and thus the temperature of the power components 62 and 72 may be higher and the performance thereof will be deteriorated.

Figure 15:
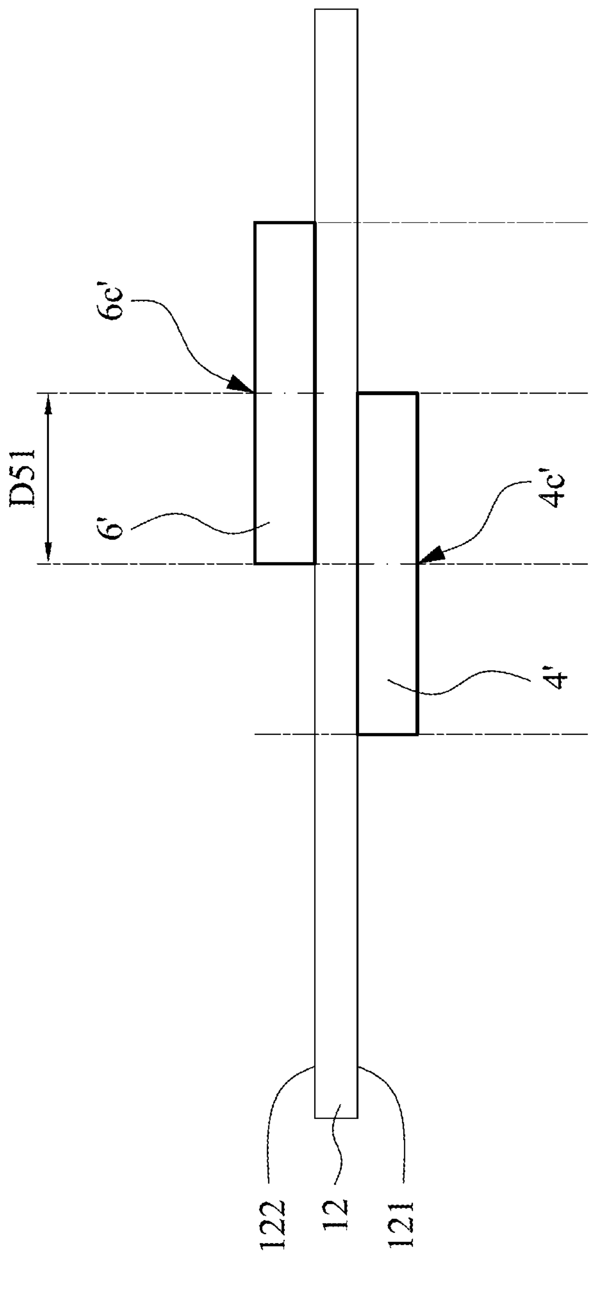
FIG. 15 is a cross-section of an exemplary power module according to some embodiments of the present disclosure.
Figure 16:
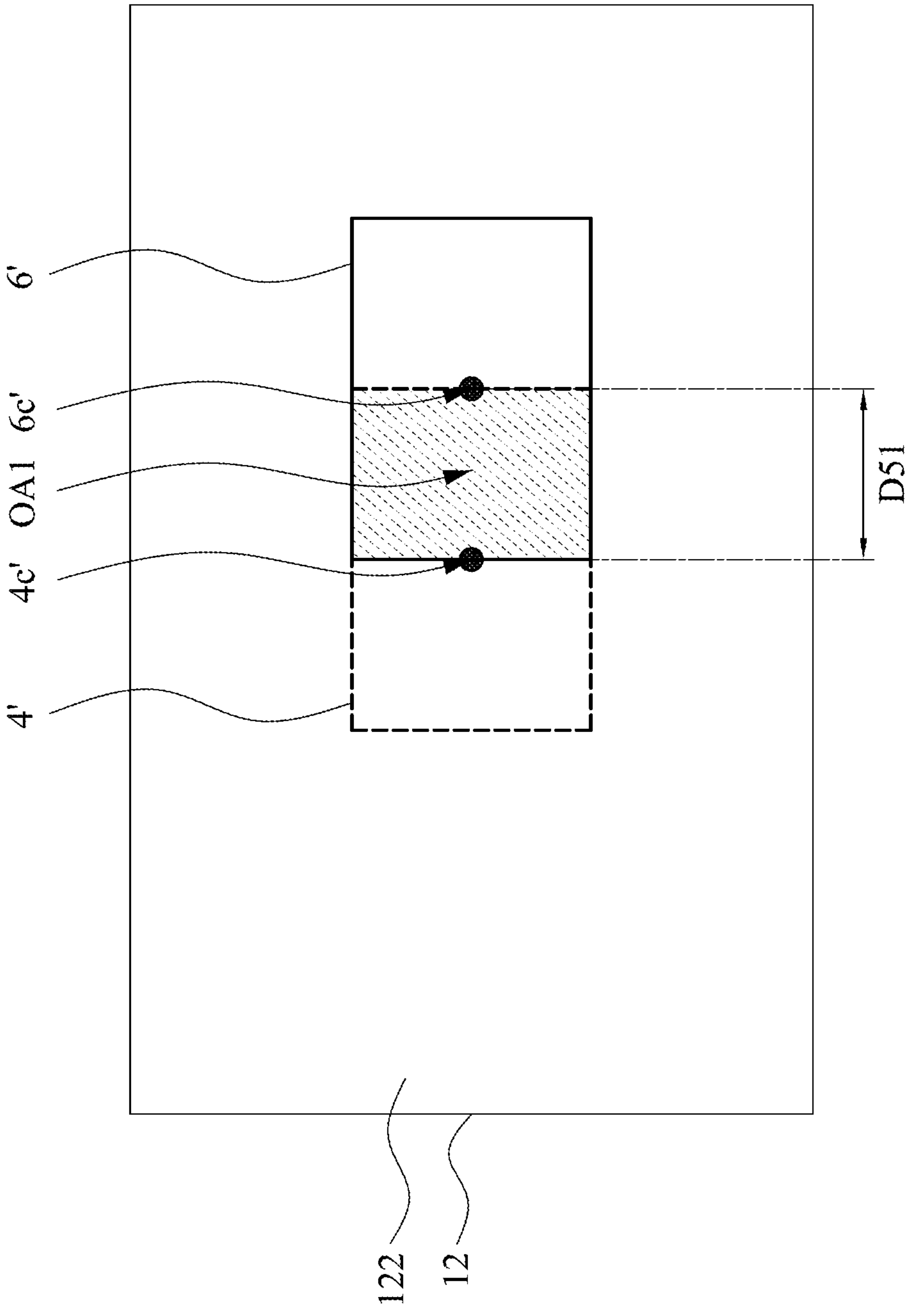
FIG. 16 is a perspective view of an exemplary power module according to some embodiments of the present disclosure.

FIG. 15 is a cross-section of an exemplary power module according to some embodiments of the present disclosure. FIG. 16 is a perspective view of an exemplary power module according to some embodiments of the present disclosure. As shown in FIG. 15 and FIG. 16, a power component 4' may be disposed on the side 121 of the conductive plate 12 and a power component 6' may be disposed on the side 122 of the conductive plate 12. A geometric center 4' of the power component 4' may be shifted from a geometric center 6*c*' of the power component 6' with a distance D51. The center 4*c*' of the power component 4' may be substantially aligned with an edge of the power component 6' in a direction perpendicular to the side 121 of the conductive plate 12. The center 6*c*' of the power component 6' may be substantially aligned with an edge of the power component 4' in a direction perpendicular to the side 121 of the conductive plate 12. A projecting area of the power component 4' and a projecting area of the power component 6' may overlap with an area OA1 from the top view. The dislocation relationship of the power components 4' and 6' can prevent the heat generated by the power components 4' and the power component 6' from being accumulated and thus the temperature of the power components 4' and 6' may be retained in an acceptable range and the performance thereof can be improved.

Figure 17:
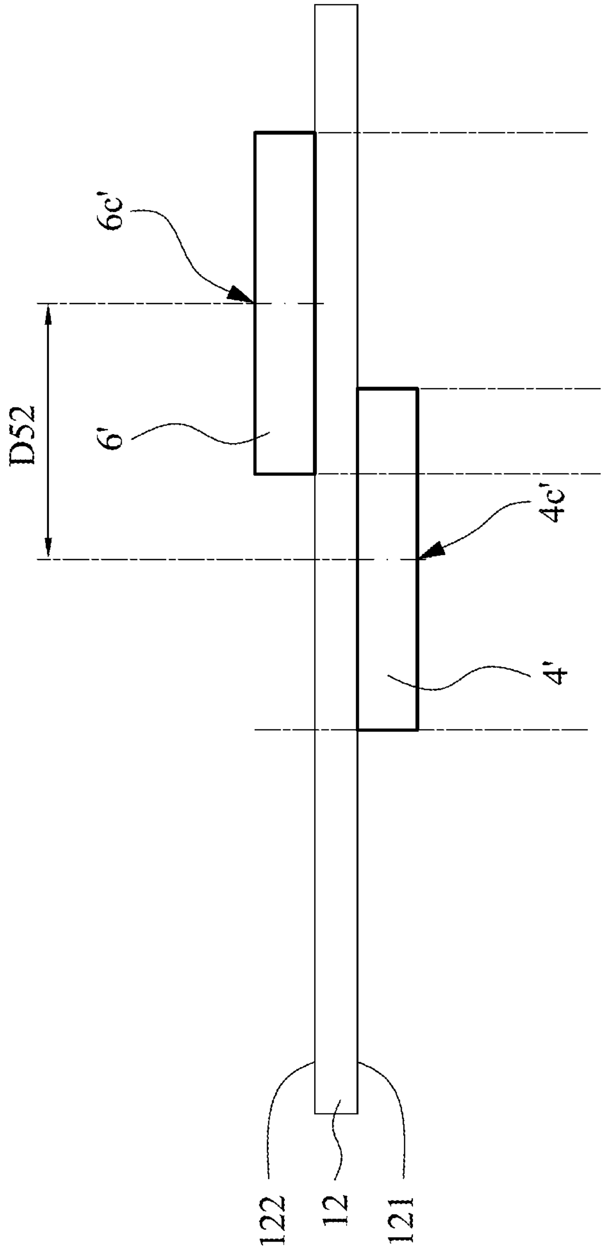
FIG. 17 is a cross-section of an exemplary power module according to some embodiments of the present disclosure.
Figure 18:
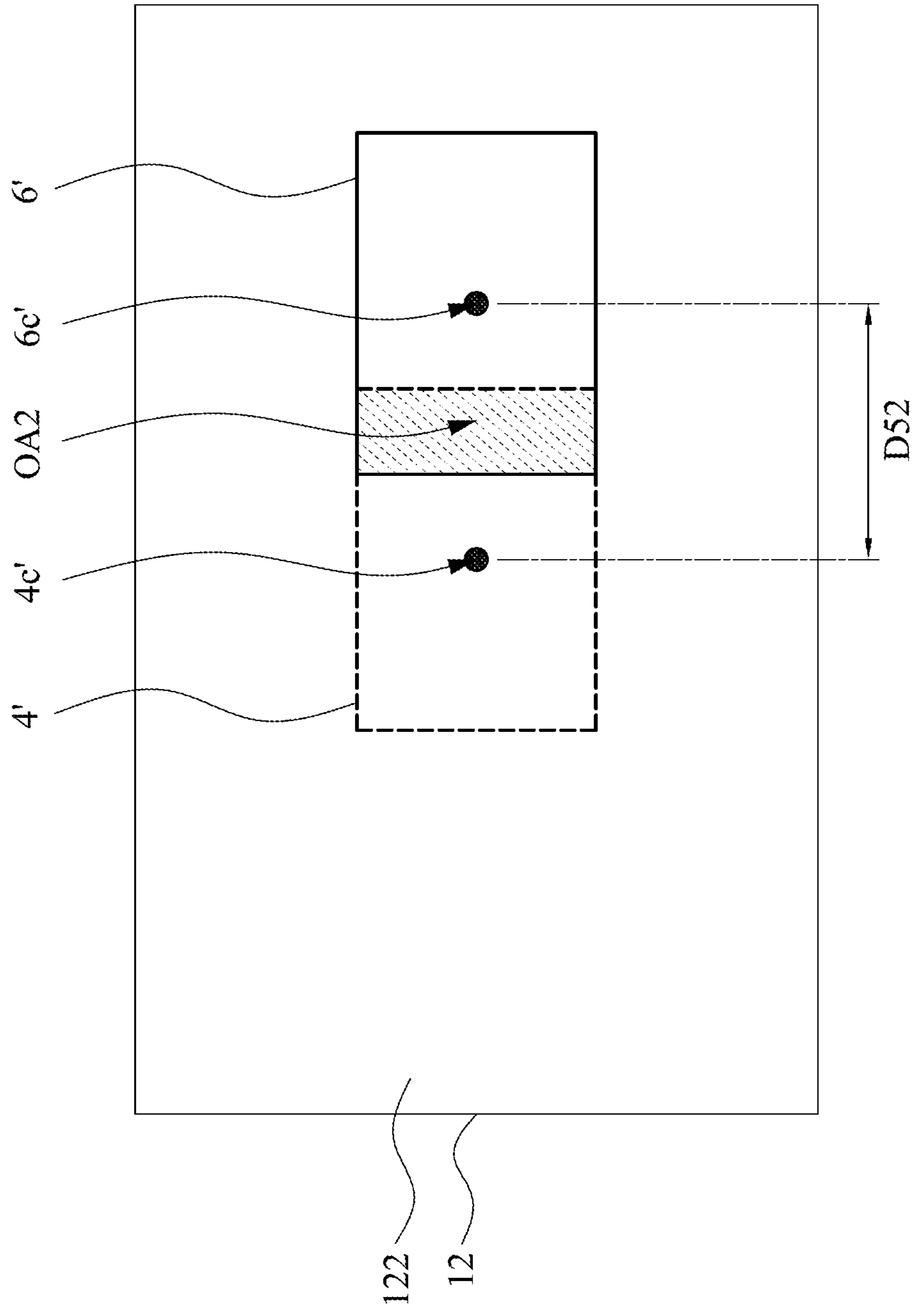
FIG. 18 is a perspective view of an exemplary power module according to some embodiments of the present disclosure.

FIG. 17 is a cross-section of an exemplary power module according to some embodiments of the present disclosure. FIG. 18 is a perspective view of an exemplary power module according to some embodiments of the present disclosure. As shown in FIG. 17 and FIG. 18, the geometric center 4' of the power component 4' may be shifted from a geometric center 6*c*' of the power component 6' with a distance D52, which is greater than the distance D51 in FIG. 15 and FIG. 16. A projecting area of the power component 4' and a projecting area of the power component 6' may overlap with an area OA2 from the top view, which is smaller than the area OA1 in FIG. 16. The dislocation relationship of the power components 4' and 6' can prevent the heat generated by the power components 4' and the power component 6' from being accumulated and thus the temperature of the power components 4' and 6' may be retained in an acceptable range and the performance thereof can be improved.

Figure 19:
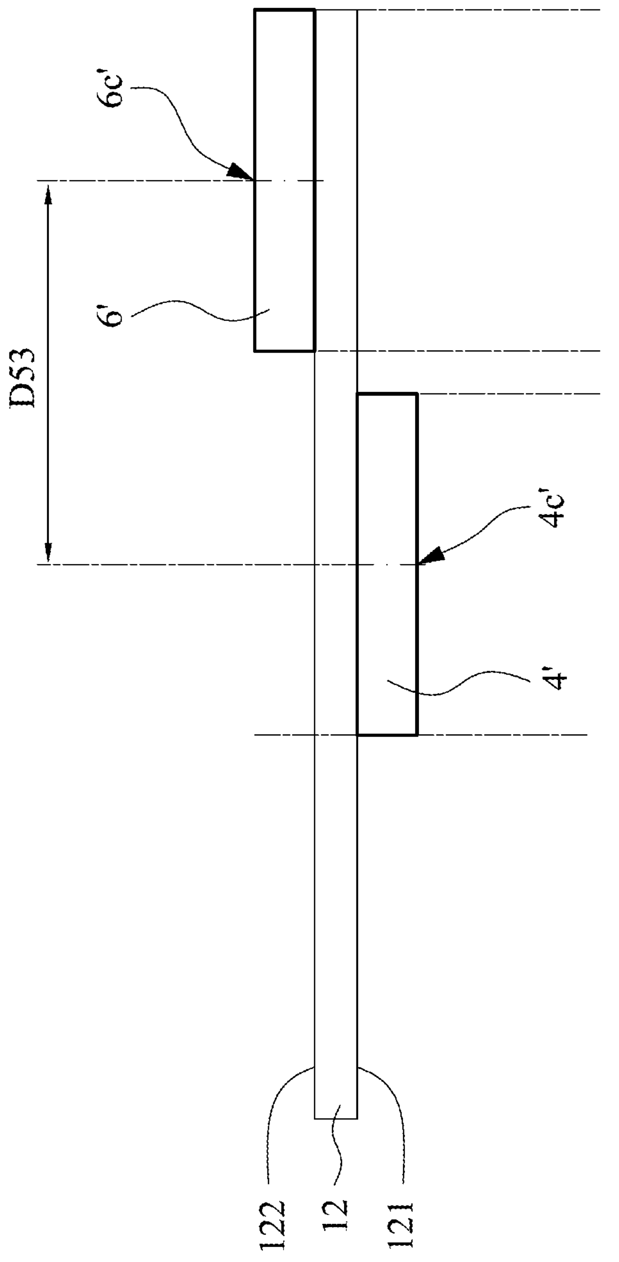
FIG. 19 is a cross-section of an exemplary power module according to some embodiments of the present disclosure.
Figure 20:
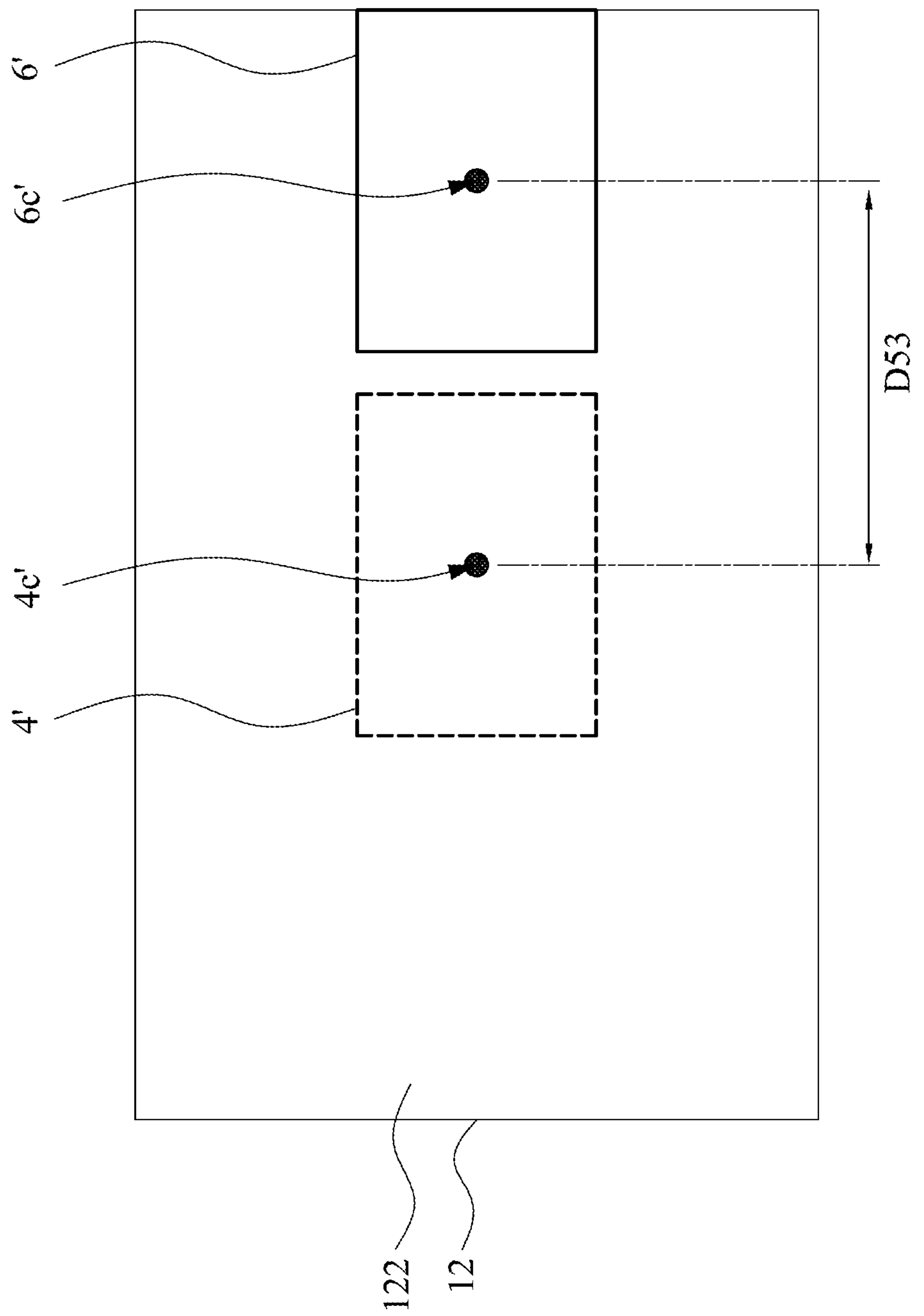
FIG. 20 is a perspective view of an exemplary power module according to some embodiments of the present disclosure.

FIG. 19 is a cross-section of an exemplary power module according to some embodiments of the present disclosure. FIG. 20 is a perspective view of an exemplary power module according to some embodiments of the present disclosure. As shown in FIG. 19 and FIG. 20, the geometric center 4' of the power component 4' may be shifted from a geometric center 6*c*' of the power component 6' with a distance D53, which is greater than the distance D52 in FIG. 17 and FIG. 18. A projecting area of the power component 4' and a projecting area of the power component 6' may not overlap with each other from the top view. The dislocation relationship of the power components 4' and 6' can prevent the heat generated by the power components 4' and the power component 6' from being accumulated and thus the temperature of the power components 4' and 6' may be retained in an acceptable range and the performance thereof can be improved.

Figure 21:
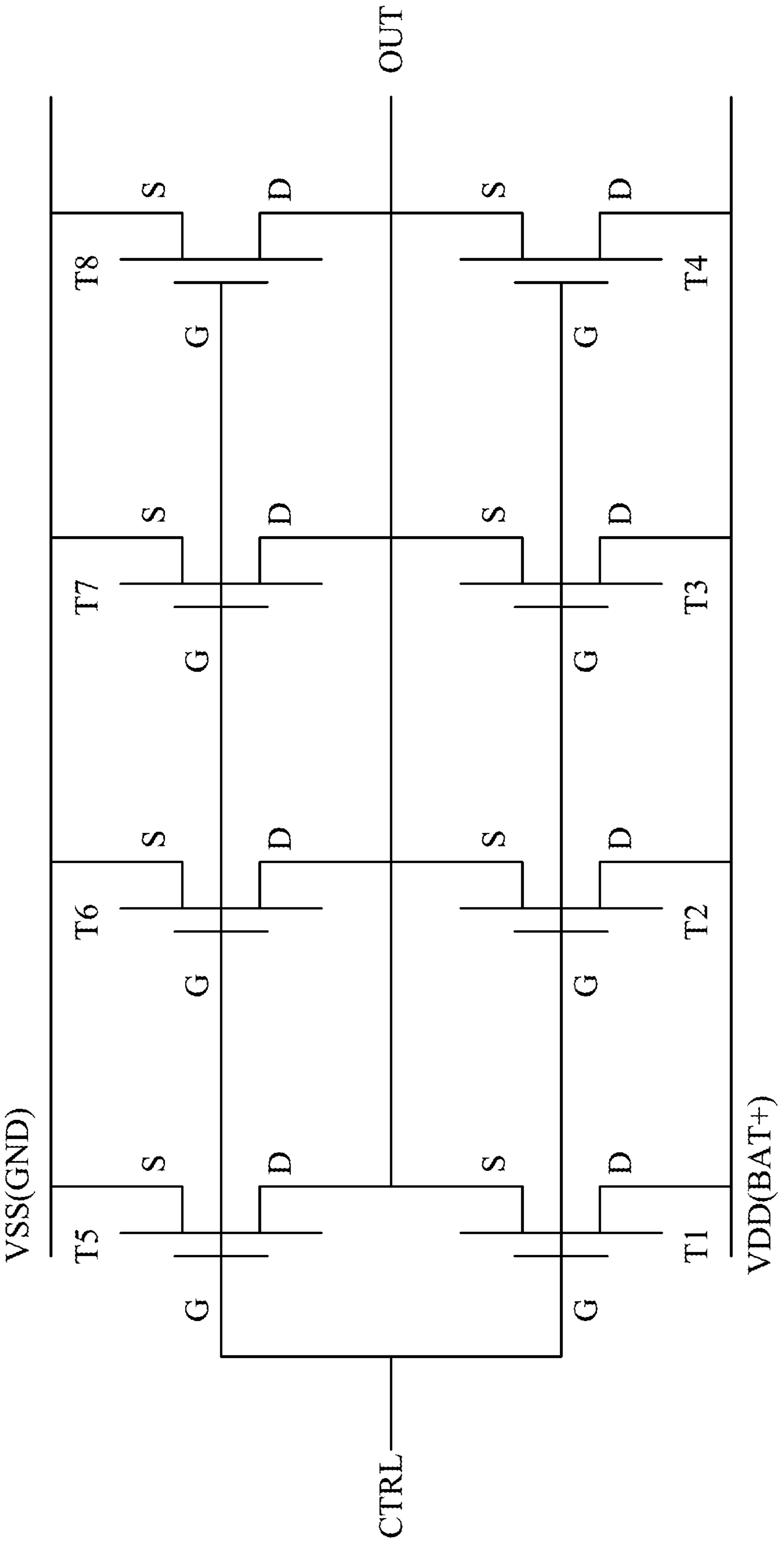
FIG. 21 is a circuit diagram of an exemplary power module according to some embodiments of the present disclosure.

FIG. 21 is a circuit diagram of an exemplary power module packaging structure (the power module 100) according to some embodiments of the present disclosure. The power module 100 may include transistors T1, T2, T3, T4, T5, T6, T7, and T8. The transistor T1 may be one of the power components 4. The transistor T1 may have a drain terminal D connected to a voltage supply VDD (BAT+, i.e., a battery), a gate terminal G configured to receive a control signal CTRL, a source terminal S connected to an output OUT. The transistor T5 may be one of the power components 6. The transistor T5 may have a drain terminal D connected to the output OUT and the source terminal S of the transistor T1, a source terminal connected to a voltage supply VSS (GND, i.e., a ground potential) and a gate terminal configured to receive the control signal CTRL. Each of the transistors T6, T7, T8 may be one of the power components 4. The transistors T6, T7, and T8 may be similar to the transistor T5. The power component 6 may include set of transistors T5~T8 and the power component 4 may include a set of transistors T1~T4, wherein the conductive plate 12 as illustrated in FIG. 1 may be configured as a drain terminal of the set of transistors T5~T8 and a source terminal of the set of transistors T1~T4. The conductive plate 11 may be configured as a drain terminal of the transistors T1~T4 of the power component 4. The conductive plate 13 may be configured as a source terminal of the transistors T5~T8 of the power component 6.

The transistors T1, T2, T3, and T4 may be connected in parallel to provide relatively high current. The transistors T1, T2, T3, and T4 may form a high side power switch. The transistors T5, T6, T7, and T8 may be connected in parallel to provide relatively high current. The transistors T5, T6, T7, and T8 may form a low side power switch.

Figure 22:
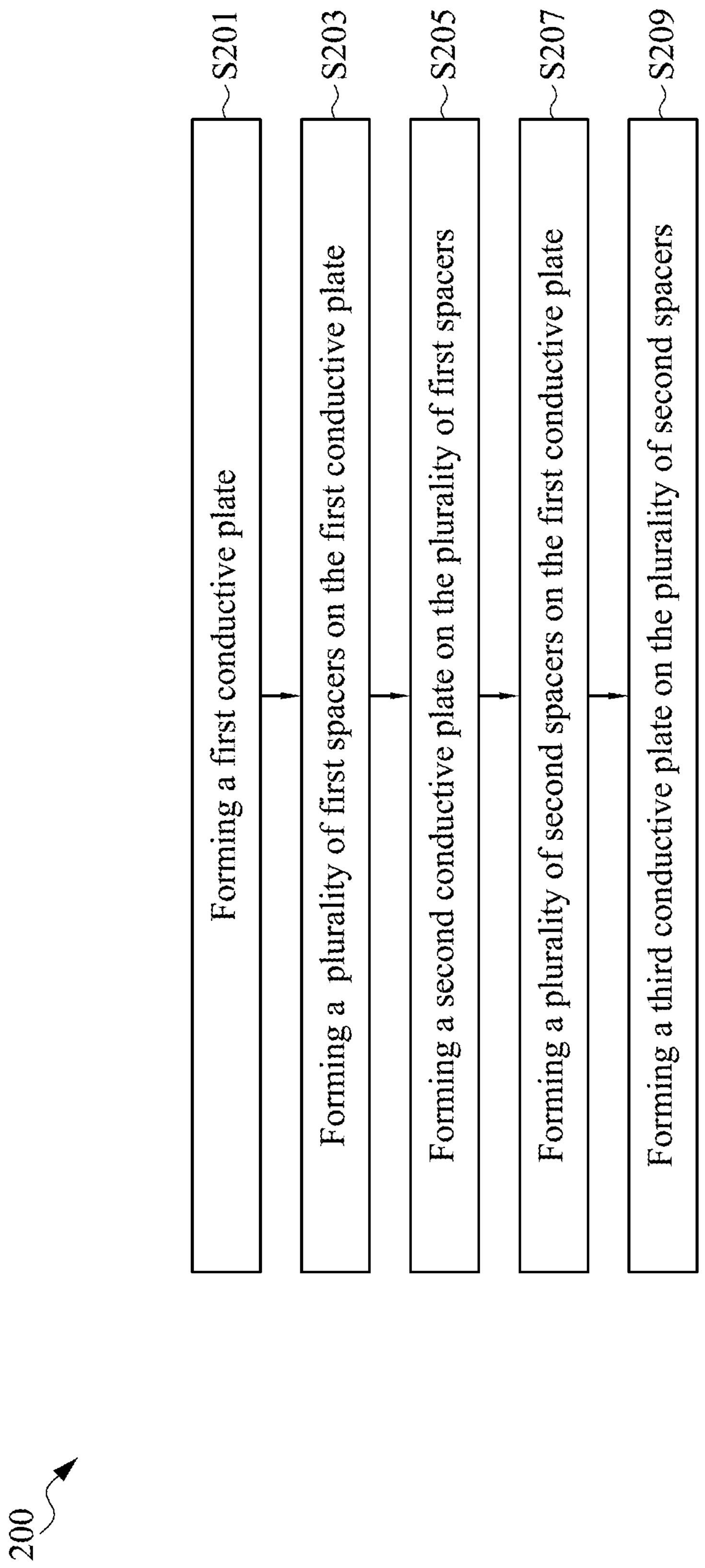
FIG. 22 is a flowchart of an exemplary method of manufacturing a power module packaging structure according to some embodiments of the present disclosure.

FIG. 22 is a flowchart of an exemplary method 200 of manufacturing a power module (e.g., the power module 100) according to some embodiments of the present disclosure.

The method 200 begins with operation S201 including forming a first conductive plate (e.g., the conductive plate 11). Operation S201 may further include forming a plurality of first semiconductor devices (e.g., the plurality of power components 4) on and electrically connected to the first conductive plate.

The method 200 continues with operation S203 including forming a plurality of first spacers (e.g., the plurality of spacers 3) on the first conductive plate.

The method 200 continues with operation S205 including forming a second conductive plate (e.g., the conductive plate 12) on the plurality of spacers 3. Operation S205 may further include forming a plurality of second semiconductor devices (e.g., the plurality of power components 6) on and electrically connected to the second conductive plate.

The method 200 continues with operation S207 including forming a plurality of second spacers (e.g., the plurality of spacers 5) on the first conductive plate.

The method 200 continues with operation S209 including forming a third conductive plate (e.g. the conductive plate 13) on the plurality of second spacers. The plurality of second semiconductor devices may be electrically connected to the third conductive plate.

The method 200 is merely an example, and is not intended to limit the present disclosure beyond what is explicitly recited in the claims. Additional operations can be provided before, during, or after each operation of the method 200, and some operations described can be replaced, eliminated, or reordered for additional embodiments of the method. In some embodiments, the method 200 can include further operations not depicted in FIG. 22. In some embodiments, the method 200 can include one or more operations depicted in FIG. 22.

Figure 23:
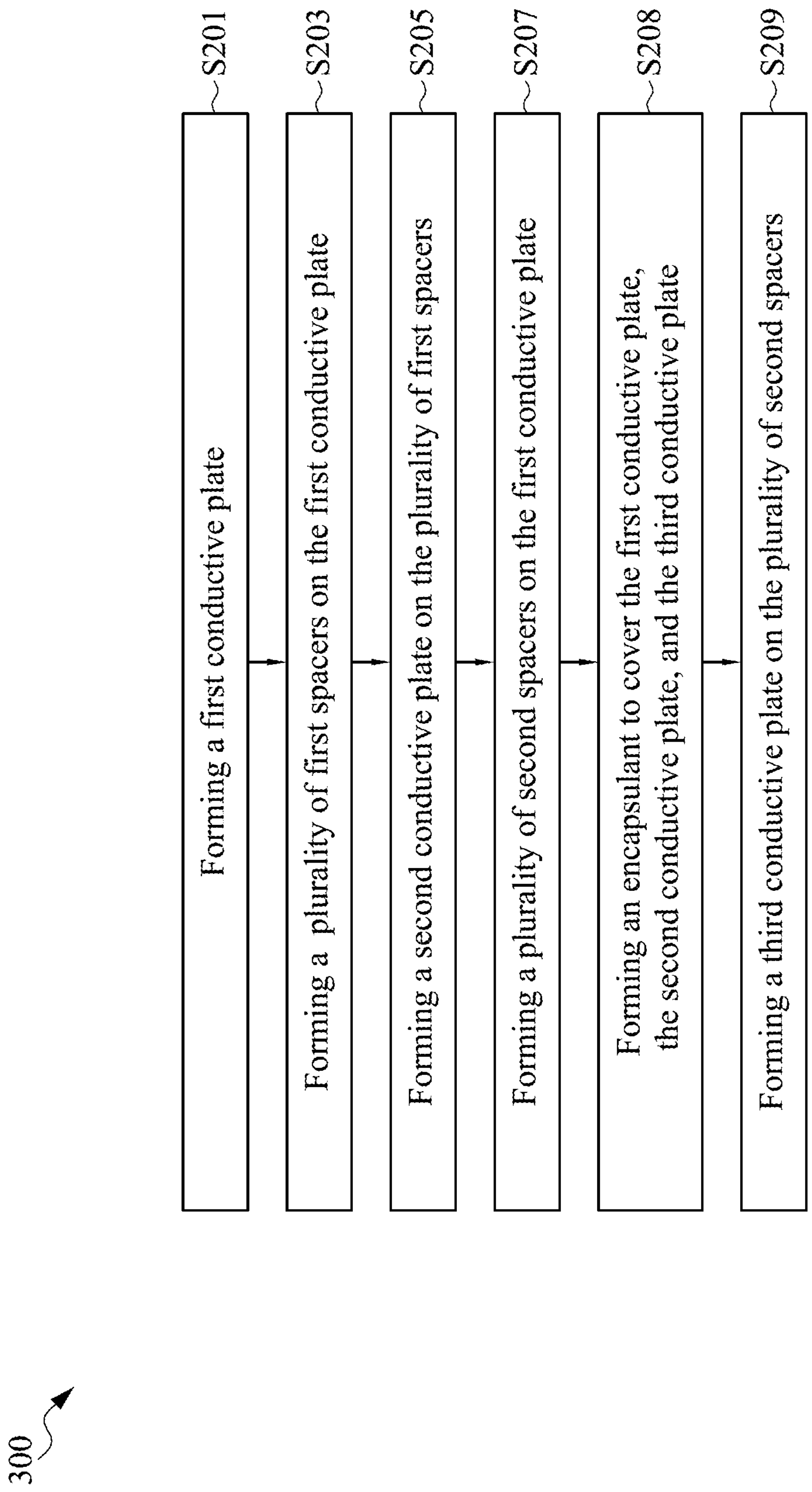
FIG. 23 is a flowchart of an exemplary method of manufacturing a power module packaging structure according to some embodiments of the present disclosure.

FIG. 23 is a flowchart of an exemplary method 300 of manufacturing a power module (e.g., the power module 100) according to some embodiments of the present disclosure. The method 300 may include operations S201, S203, S205, S207, and S209 of the method 200 as illustrated in FIG. 22.

The method 300 continues with operation S208 including forming an encapsulant (e.g., the protective layer 2) to cover the first conductive plate, the second conductive plate, and the third conductive plate. The encapsulant may be formed by transfer molding. The mold chase used in the transfer molding process may be substantially planar. In some embodiments, the mold chase used in the transfer molding process may be stepped, sawtoothed, or the like. The second conductive plate may include a window. The encapsulant may flow through the window during formation. The window allows the encapsulant to transfer from a space between the second and third conductive plates to a space between the first and second conductive plates. The encapsulant is formed in both of the spaces between the first and second conductive plates and between the second and third conductive plates in the same process. The window can be configured to control the flow of the encapsulant during the formation. The encapsulant may flow into the space between the first conductive plate and the second conductive plate to mold the bottom part of the power module packaging structure. As such, the rigidity of the power module packaging structure can be improved.

The first, second, and third conductive plates may each have a terminal portion protruding from the encapsulant for securing with an external substrate.

The method 300 is merely an example, and is not intended to limit the present disclosure beyond what is explicitly recited in the claims. Additional operations can be provided before, during, or after each operations of the method 300, and some operations described can be replaced, eliminated, or reordered for additional embodiments of the method. In some embodiments, the method 300 can include further operations not depicted in FIG. 23. In some embodiments, the method 300 can include one or more operations depicted in FIG. 23.

Figure 24:
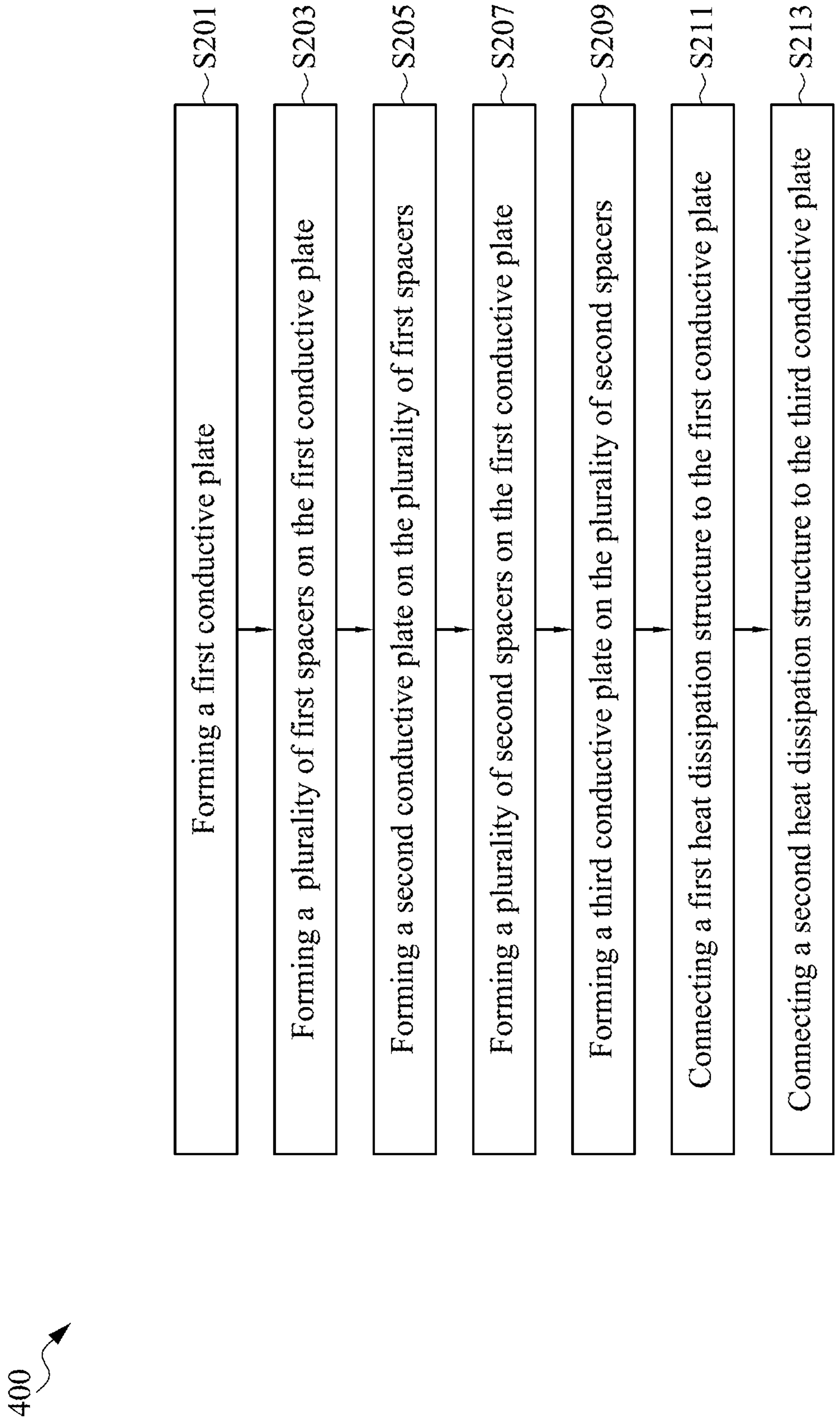
FIG. 24 is a flowchart of an exemplary method of manufacturing a power module packaging structure according to some embodiments of the present disclosure.

FIG. 24 is a flowchart of an exemplary method 400 of manufacturing a power module (e.g., the power module 100) according to some embodiments of the present disclosure. The method 400 may include operations S201, S203, S205, S207, and S209 of the method 200 as illustrated in FIG. 22.

The method 400 continues with operation S211 including connecting a first heat dissipation structure (e.g., the first heat dissipation structure 7) to the first conductive plate. The first heat dissipation structure may be configured to dissipate the heat of the power module packaging structure to an external environment.

The method 400 continues with operation S213 including connecting a second heat dissipation structure (e.g., the second heat dissipation structure 8) to the third conductive plate. The second heat dissipation structure may be configured to dissipate the heat of the power module packaging structure to an external environment.

The method 400 is merely an example, and is not intended to limit the present disclosure beyond what is explicitly recited in the claims. Additional operations can be provided before, during, or after each operations of the method 400, and some operations described can be replaced, eliminated, or reordered for additional embodiments of the method. In some embodiments, the method 400 can include further operations not depicted in FIG. 24. In some embodiments, the method 400 can include one or more operations depicted in FIG. 24.

FIG. 25 is a flowchart of an exemplary method 500 of manufacturing a power module (e.g., the power module 100) according to some embodiments of the present disclosure. The method 500 may include operations S201, S203, S205, S207, S208, and S209 of the method 300 as illustrated in FIG. 23.

The method 500 continues with Operation S202 including forming a first conductive trace (e.g., the first conductive trace 11*t*) to surround the first conductive plate. The first conductive plate is connected to the first conductive trace via a conductive leash. Operation S202 may further include forming a second conductive trace (e.g., the second conductive trace 12*t*) to surround the second conductive plate. The second conductive plate is connected to the first conductive trace via a conductive leash.

The method 500 continues with Operation S210 including removing conductive leashes. As such, the first conductive plate and the first conductive trace may be spaced apart and the second conductive plate and the second conductive trace may be spaced apart.

The method 500 is merely an example, and is not intended to limit the present disclosure beyond what is explicitly recited in the claims. Additional operations can be provided before, during, or after each operation of the method 500, and some operations described can be replaced, eliminated, or reordered for additional embodiments of the method. In some embodiments, the method 500 can include further operations not depicted in FIG. 25. In some embodiments, the method 500 can include one or more operations depicted in FIG. 25.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A power module, comprising:

a first conductive plate having a first side and a second side opposite to the first side;

a first power component disposed at the first side;

a second power component disposed at the second side, wherein the first power component has a first geometric center and the second power component has a second geometric center; and a plurality of conductive plates having a plurality of end portions each having a keyhole, the first conductive plate included in the plurality of conductive plates, wherein a projection of an end of the first power component is aligned with the second geometric center of the second power component from the cross-section view, wherein the plurality of end portions are at different elevations, and wherein the end portions are non-overlapping with each other from a top view.

2. The power module of claim 1, further comprising:

a second conductive plate included in the plurality of conductive plates and disposed below the second power component; and a first heat dissipation structure disposed on the second conductive plate, wherein the second conductive plate is configured to transfer a heat from the second power component to the first heat dissipation structure.

3. The power module of claim 1, further comprising:

a first spacer disposed on the first power component and electrically connecting the first power component to a third conductive plate included in the plurality of conductive plates and disposed above the first power component, wherein an area of a projection of the first spacer falls within an area of a projection of the first power component from a top view.

4. The power module of claim 3, further comprising a second spacer disposed on and electrically connected to the second power component, wherein the first spacer and the second spacer are non-overlapping from the top view.

5. The power module of claim 4, wherein the first power component comprises a first transistor and the second power component comprises a second transistor, and wherein the first spacer is electrically connected to a source terminal of the first transistor and the second spacer is electrically connected to a source terminal of the second transistor.

6. The power module of claim 4, wherein a projecting area of the second power component and a projecting area of the first power component overlap with an area from the top view, wherein a dislocation of the first spacer and the second spacer prevents a heat generated by the first power components and the second power component from being accumulated.

7. A power module, comprising:

a first conductive plate comprising a first part and a second part spaced apart from the first part, wherein the first part of the first conductive plate comprises a first side and a second side opposite to the first side;

a first power component disposed on the first part and at the first side of the first conductive plate and electrically connecting to the second part of the first conductive plate through a conductive bond wiring;

a second power component disposed at the second side, wherein the first power component has a first geometric center and the second power component has a second geometric center; and a plurality of conductive plates having a plurality of end portions each having a keyhole, the first conductive plate included in the plurality of conductive plates, wherein a projection of an end of the first power component is aligned with the second geometric center of the second power component from the cross-section view.

8. The power module of claim 7, wherein the plurality of end portions are at different elevations.

9. The power module of claim 8, wherein the end portions are non-overlapping with each other along a direction perpendicular to the first side of the first conductive plate.

10. The power module of claim 7, further comprising:

a first spacer disposed on the first power component and electrically connecting the first power component to a third conductive plate included in the plurality of conductive plates and disposed above the first power component, wherein an area of a projection of the first spacer falls within an area of a projection of the first power component from a top view.

11. The power module of claim 10, further comprising a second spacer disposed on and electrically connected to the second power component, wherein the first spacer and the second spacer are non-overlapping from the top view, and wherein the first power component comprises a first transistor and the second power component comprises a second transistor, and wherein the first spacer is electrically connected to a source terminal of the first transistor and the second spacer is electrically connected to a source terminal of the second transistor.

12. The power module of claim 11, wherein a projecting area of the second power component and a projecting area of the first power component overlap with an area from the top view, wherein a dislocation of the first spacer and the second spacer prevents a heat generated by the first power components and the second power component from being accumulated.

13. A power module, comprising:

a first power component;

a second power component disposed below the first power component;

a first conductive plate disposed between the first power component and the second power component and defining an opening through the first conductive plate, wherein the first conductive plate has a first side and a second side opposite to the first side; and a protective layer encapsulating the first power component and second power component and partially disposed within the opening, wherein the first power component has a first geometric center and the second power component has a second geometric center; and a plurality of conductive plates having a plurality of end portions each having a keyhole, the first conductive plate included in the plurality of conductive plates, wherein a projection of an end of the first power component is aligned with the second geometric center of the second power component from the cross-section view, wherein the end portions are at different levels with respect to a bottom surface of the protective layer, and wherein the end portions are non-overlapping with each other from a top view.

14. The power module of claim 13, further comprising:

a first spacer disposed on the first power component and electrically connecting the first power component to a third conductive plate included in the plurality of conductive plates and disposed above the first power component, wherein an area of a projection of the first spacer falls within an area of a projection of the first power component from a top view.

15. The power module of claim 14, further comprising a second spacer disposed on and electrically connected to the second power component, wherein, from the top view, the first spacer is closer to the opening than the second spacer is in a first direction and a second direction perpendicular to the first direction.

16. The power module of claim 13, wherein a portion of the protective layer disposed within the opening has a crossed shape.

* * * * *